(12) United States Patent
Wang et al.

(10) Patent No.: US 11,482,788 B2
(45) Date of Patent: Oct. 25, 2022

(54) ANTENNA DEVICE AND METHOD FOR MANUFACTURING ANTENNA DEVICE

(71) Applicant: TAIWAN SEMICONDUCTOR MANUFACTURING CO., LTD., Hsinchu (TW)

(72) Inventors: Chuei-Tang Wang, Taichung (TW); Chung-Hao Tsai, Changhua County (TW); Jeng-Shien Hsieh, Kaohsiung (TW); Wei-Heng Lin, Taipei (TW); Kuo-Chung Yee, Taoyuan (TW); Chen-Hua Yu, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 36 days.

(21) Appl. No.: 17/013,300

(22) Filed: Sep. 4, 2020

(65) Prior Publication Data
US 2020/0411996 A1 Dec. 31, 2020

Related U.S. Application Data

(63) Continuation of application No. 15/245,022, filed on Aug. 23, 2016, now Pat. No. 10,770,795.

(60) Provisional application No. 62/342,735, filed on May 27, 2016.

(51) Int. Cl.
| | | |
|---|---|---|
| H01L 23/22 | (2006.01) |
| H01L 23/24 | (2006.01) |
| H01Q 9/06 | (2006.01) |
| H01Q 1/22 | (2006.01) |
| H01Q 3/24 | (2006.01) |
| H01Q 1/36 | (2006.01) |
| H01Q 1/48 | (2006.01) |

(52) U.S. Cl.
CPC ............ *H01Q 9/065* (2013.01); *H01Q 1/2283* (2013.01); *H01Q 1/36* (2013.01); *H01Q 1/48* (2013.01); *H01Q 3/24* (2013.01)

(58) Field of Classification Search
CPC ........ H01Q 9/065; H01Q 3/24; H01Q 1/2283; H01Q 1/36; H01Q 1/48
See application file for complete search history.

(56) References Cited

U.S. PATENT DOCUMENTS

| | | | |
|---|---|---|---|
| 6,404,062 B1 | 6/2002 | Taniguchi et al. |
| 8,199,518 B1 | 6/2012 | Chun et al. |
| 2005/0285794 A1 | 12/2005 | Tang et al. |
| 2009/0295512 A1* | 12/2009 | Tiffin | H01P 5/187 |
| | | | 333/24 R |
| 2009/0309212 A1 | 12/2009 | Shim et al. |
| 2011/0239459 A1 | 10/2011 | Kwon et al. |
| 2012/0062439 A1 | 3/2012 | Liao et al. |
| 2014/0110841 A1* | 4/2014 | Beer | H01L 23/49816 |
| | | | 257/738 |

(Continued)

*Primary Examiner* — Ismail A Muse
(74) *Attorney, Agent, or Firm* — Maschoff Brennan

(57) ABSTRACT

An antenna device includes a package, a radiating element, and a director. The package includes a radio frequency (RF) die and a molding compound in contact with a sidewall of the RF die. The radiating element is in the molding compound and electrically coupled to the RF die. The director is in the molding compound, wherein the radiating element is between the director and the RF die, and a top of the radiating element is substantially coplanar with a top of the director.

20 Claims, 23 Drawing Sheets

(56) References Cited

U.S. PATENT DOCUMENTS

| | | |
|---|---|---|
| 2014/0131858 A1 | 5/2014 | Pan et al. |
| 2014/0183731 A1 | 7/2014 | Lin et al. |
| 2014/0210101 A1 | 7/2014 | Lin et al. |
| 2014/0252647 A1* | 9/2014 | Huang ............... H01L 23/5389 257/774 |
| 2014/0285289 A1 | 9/2014 | Herbsommer et al. |
| 2015/0070228 A1* | 3/2015 | Gu ..................... H01Q 1/2283 343/727 |
| 2015/0145142 A1 | 5/2015 | Lin et al. |
| 2015/0303158 A1 | 10/2015 | Huang et al. |
| 2016/0233292 A1 | 8/2016 | Chen et al. |
| 2017/0236776 A1 | 8/2017 | Huynh et al. |
| 2020/0112100 A1 | 4/2020 | Ryoo et al. |

* cited by examiner

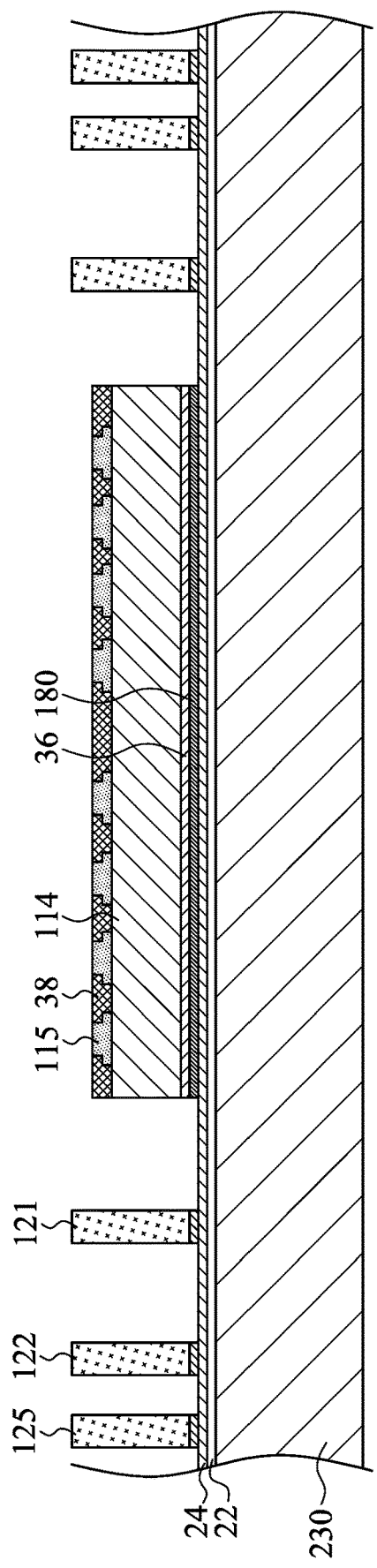
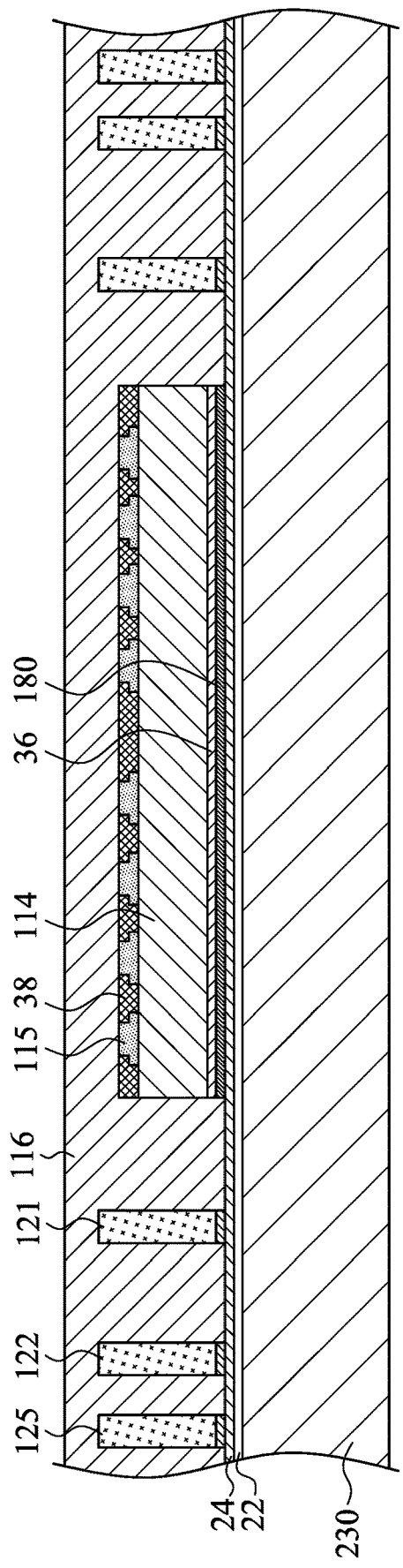
Fig. 10
Fig. 11

ANTENNA DEVICE AND METHOD FOR MANUFACTURING ANTENNA DEVICE

PRIORITY CLAIM AND CROSS-REFERENCE

This present application is a Continuation Application of U.S. patent application Ser. No. 15/245,022, filed on Aug. 23, 2016, now U.S. Pat. No. 10,770,795, issued on Sep. 8, 2020, which claims priority to U.S. Provisional Application Ser. No. 62/342,735, filed May 27, 2016, which are herein incorporated by reference in their entirety.

BACKGROUND

A system in package (SiP) is a number of integrated circuits enclosed in a single module. The SiP may perform several functions of an electronic device, and is typically used inside a mobile phone, digital music player, etc. Dies in a SiP may be stacked on a substrate and connected by conductive wires. Alternatively, with flip chip technology, solder bumps may be used to join stacked chips together. This means that a multifunctional unit may be built in a multi-chip package, so that few external components need to be added to make it work.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4-13 are cross-sectional views of a method for manufacturing an antenna device according to some embodiments of the present disclosure;

DETAILED DESCRIPTION

Figure 1:
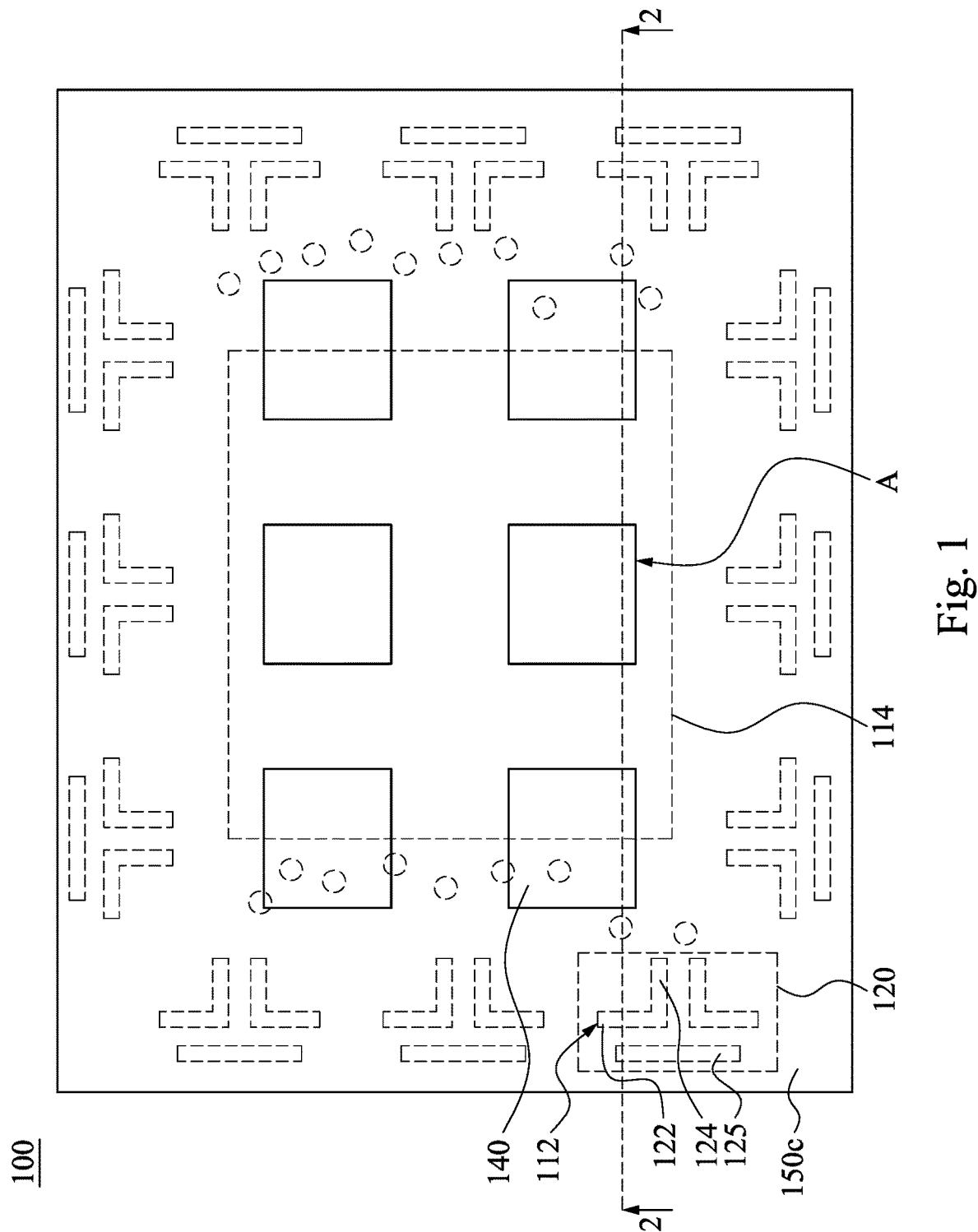
FIG. 1 is a top view of an antenna device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
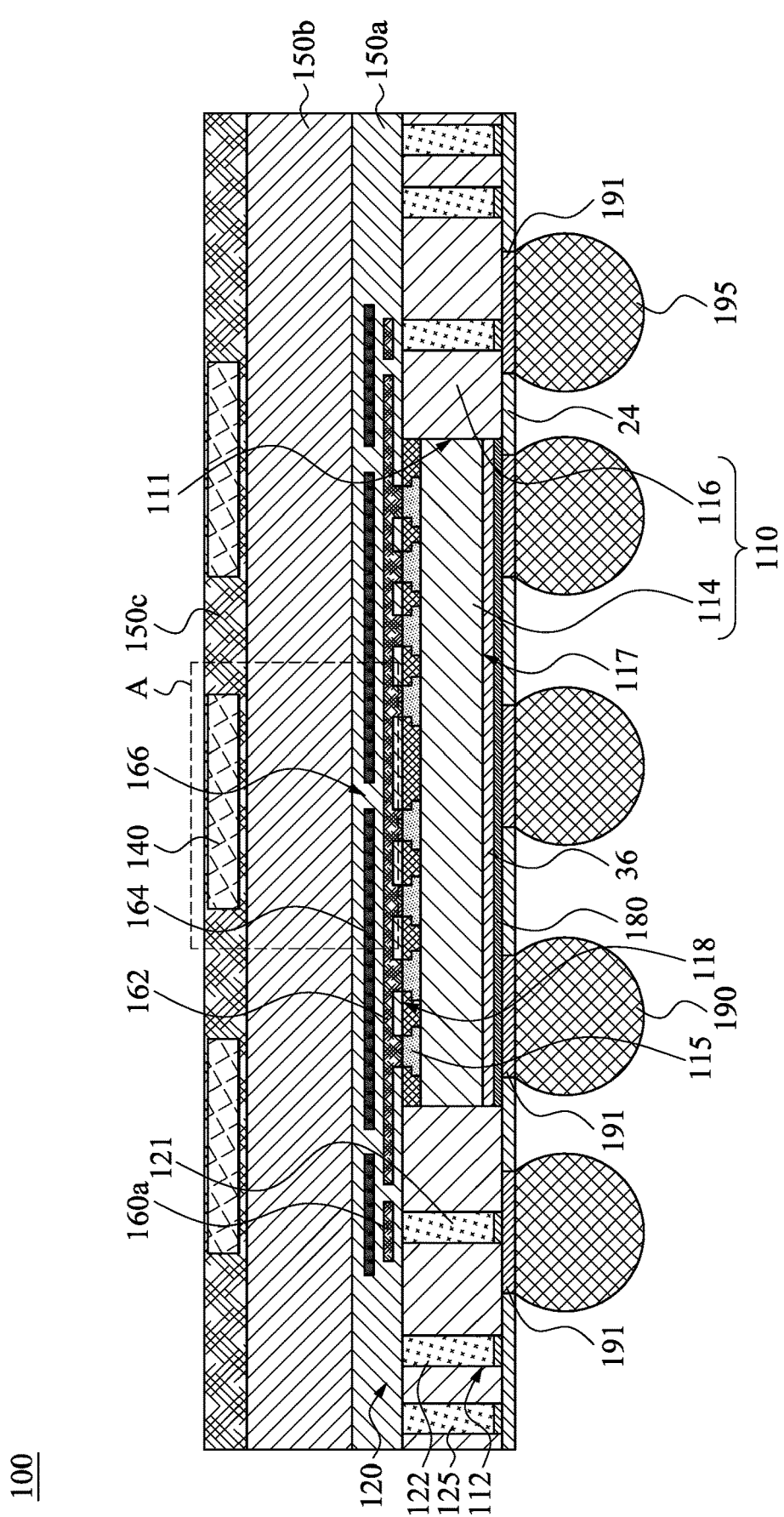
FIG. 2 is a cross-sectional view of the antenna device taken along line 2 of FIG. 1.

FIG. 1 is a top view of an antenna device 100 according to some embodiments of the present disclosure. FIG. 2 is a cross-sectional view of the antenna device 100 taken along line 2 of FIG. 1. As shown in FIG. 1 and FIG. 2, the antenna device 100 includes a package 110 and at least one first antenna 120. The package 110 includes at least one radio frequency (RF) die 114 and a molding compound 116, and the molding compound 116 is in contact with at least one sidewall 111 of the RF die 114. The molding compound 116 has at least one through hole 112 therein. The first antenna 120 has at least one conductor 122. The conductor 122 is present in the through hole 112 of the molding compound 116 and is operatively connected to the RF die 114. In other words, the first antenna 120 has at least one conductive feature or conductive via (i.e., the conductor 122) that is present in the molding compound 116.

Figure 3:
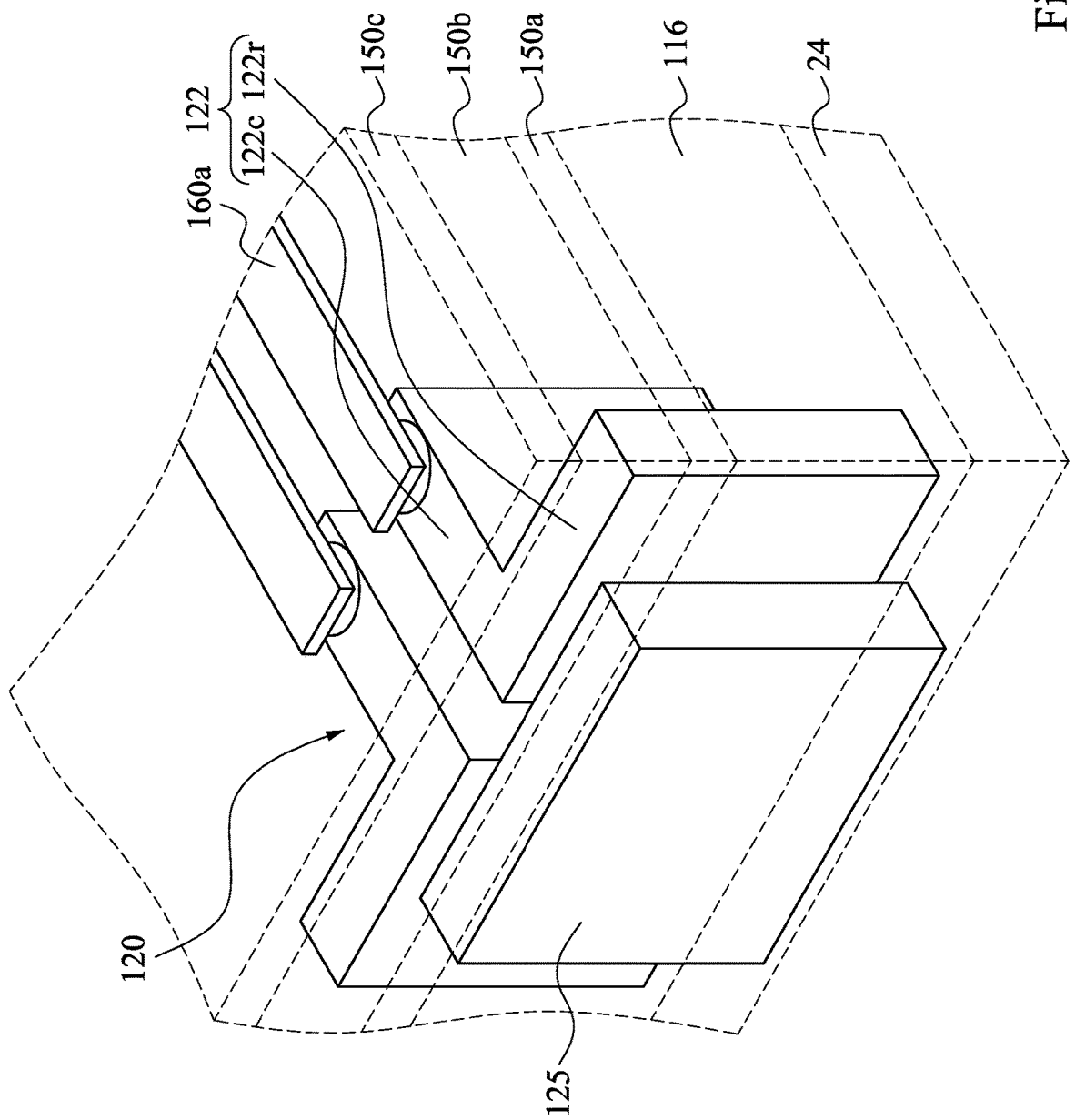
FIG. 3 is a perspective view of a first antenna of FIG. 1.

FIG. 3 is a perspective view of the first antenna 120 of FIG. 1. As shown in FIG. 3, in some embodiments, the first antenna 120 is a dipole antenna. The dipole antenna includes two conductors 122 in the molding compound 116. The top-view shape of at least one of the conductors 122 is substantially L-shaped. That is, the conductors 122 are L-shaped conductive walls in the molding compound 116. In some embodiments, at least one of the conductors 122 includes a radiating element 122r and a connection element 122c. The connection element 122c is connected to the radiating element 122r to form the L-shaped conductive wall.

As shown in FIG. 1 and FIG. 2, since the RF die 114 is disposed in the molding compound 116, miniaturization of the antenna device 100 can be achieved. In some embodiments, the total thickness of the antenna device 100 may be in a range from about 400 µm to about 700 µm, such as 600 µm.

The RF die 114 may be, for example, a millimeter wave (MMW) semiconductor chip, such as a 60 GHz RF chip, which can be used in a WiFi communication module. Moreover, the antenna device 100 may include other types of dies (not shown) therein to increase other functions. As a result of such a configuration, the antenna device 100 is a MMW system in package (SiP).

In some embodiments, the first antenna 120 further includes at least one director 125 present adjacent to the radiating elements 122r, and the radiating elements 122r are present between the director 125 and the RF die 114 (FIG. 1). The top-view shape of the director 125 is substantially straight, and the director 125 is a conductive wall in the molding compound 116. The director 125 may increase the gain of the first antenna 120 at high frequency.

Referring to FIG. 2, the antenna device 100 further includes at least one dielectric layer 150a over the RF die 114 and the molding compound 116. Moreover, the antenna device 100 further includes at least one redistribution layer 160a in the dielectric layer 150a and electrically connecting the RF die 114 and the conductors 122 of the first antenna 120. The RF die 114 has two opposite surfaces 117, 118. The RF die 114 has at least one conductive pillar 115 on the surface 118 of the RF die 114 facing the dielectric layer 150a. The redistribution layer 160a is electrically connected to the conductive pillar 115 of the RF die 114. The connection element 122c (FIG. 3) of the conductor 122 is electrically connected to the redistribution layer 160a, such that the first antenna 120 is electrically connected to the RF die 114. In other words, the RF die 114 may receive signals from the first antenna 120 through the redistribution layer 160a, or may send signals to the first antenna 120 through the redistribution layer 160a. Since there is no solder bump between the RF die 114 and the radiating elements 122r (FIG. 3) of the first antenna 120, power consumption between the RF die 114 and the first antenna 120 may be reduced.

In some embodiments, the antenna device 100 may further include at least one second antenna, and the second antenna includes at least one feeding line 162, at least one ground element 164, at least one dielectric layer 150b, and at least one radiating element 140. The feeding line 162 and the ground element 164 may be present in different layers. Alternatively, in some embodiments, the feeding line 162 and the ground element 164 may be substantially coplanar or in the same layer, and the feeding line 162 and the ground element 164 may be portions of the redistribution layer 160a. The feeding line 162 is present in the dielectric layer 150a and is electrically connected to the RF die 114. The ground element 164 is present in the dielectric layer 150a and has at least one aperture 166 therein, and a projection of the radiating element 140 on the ground element 164 overlaps with the aperture 166 of the ground element 164. The dielectric layer 150b is over the ground element 164 and the dielectric layer 150a. The radiating element 140 is present on the dielectric layer 150b, and the radiating element 140 is operatively connected to the RF die 114. Through such a configuration, the ground element 164 is used as a ground plane for the radiating element 140, and the radiating element 140, the ground element 164, and the feed line 162 may function as a patch antenna. For example, an area A shown in FIG. 2 may be regarded as a patch antenna.

When the antenna device 100 is in operation, the RF die 114 may receive signals from the radiating element 140 through the feeding line 162, or may send signals to the radiating element 140 through the feeding line 162. Since there is no solder bump between the RF die 114 and the radiating element 140, power consumption between the RF die 114 and the patch antenna (i.e., the area A including the feeding line 162, the ground element 164, and the radiating element 140) may be reduced.

In some embodiments, the antenna device 100 may further include a dielectric layer 150c. The dielectric layer 150c is over the dielectric layer 150b, and the radiating element 140 is present in the dielectric layer 150c. The dielectric layer 150c may prevent two adjacent radiating elements 140 from being in electrical contact with each other.

Referring to FIG. 1, the antenna device 100 includes plural first antennas 120 and plural radiating elements 140, and the first antennas 120 are arranged adjacent to the edges of the molding compound 116, such that the radiating elements 140 are surrounded by the first antennas 120, and the size of the antenna device 100 may be reduced. It is to be noted that the number of the first antennas 120 and the number of the radiating elements 140 shown in FIG. 1 are for illustration, and various embodiments of the present disclosure are not limited in this regard.

Referring to FIG. 2, the antenna device 100 may further include a thermal plate 180. The thermal plate 180 is thermally coupled with the surface 117 of the RF die 114 facing away from the dielectric layer 150a, for example, through a thermal interface material 36. The surface 117 is at the rear side of the RF die 114.

Furthermore, the antenna device 100 may further include at least one buffer layer 24 and UBM (under-bump metallurgy) layers 191. The buffer layer 24 is present on the surface 117 of the package 110 facing away from the dielectric layer 150a, and the UBM layers 191 are present in the buffer layer 24, in which some of the UBM layers 191 are in contact with the thermal plate 180, and some of the UBM layers 191 are in contact with through integrated fan-out vias (TIVs) 121.

Thermally conductive bumps 190 and electrical connectors 195 are respectively present on the UBM layers 191, in which the electrical connectors 195 are electrically connected to the TIVs 121 and the thermally conductive bumps 190 are thermally coupled with the thermal plate 180. The thermal plate 180 may transfer heat from the RF die 114 to the thermally conductive bump 190, thereby reducing the working temperature of the RF die 114. In some embodiments, the thermal plate 180 may cover the surface 117 of the RF die 114. In other words, the area of the thermal plate 180 may be substantially the same as or larger than the area of the surface 117 of the RF die 114. As a result of such a design, the RF die 114 may have a large area through which thermal spreading occurs via the thermal plate 180 and the thermally conductive bump 190, which are present under and adjacent to the RF die 114.

Figure 4:
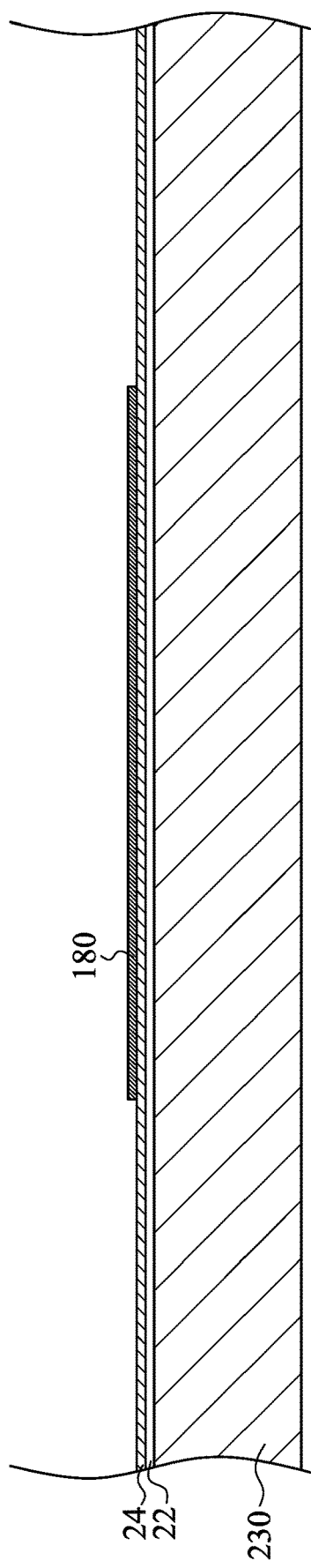

FIGS. 4-13 are cross-sectional views of a method for manufacturing an antenna device according to some embodiments of the present disclosure. Referring to FIG. 4, an adhesive layer 22 is formed on a carrier 230. The carrier 230 may be a blank glass carrier, a blank ceramic carrier, or the like. The adhesive layer 22 may be made of an adhesive, such as ultra-violet (UV) glue, light-to-heat conversion (LTHC) glue, or the like, although other types of adhesives may be used. A buffer layer 24 is formed over the adhesive layer 22. The buffer layer 24 is a dielectric layer, which may be a polymer layer. The polymer layer may include, for example, polyimide, polybenzoxazole (PBO), benzocyclobutene (BCB), an ajinomoto buildup film (ABF), a solder resist film (SR), or the like. The buffer layer 24 is a substantially planar layer having a substantially uniform thickness, in which the thickness may be greater than about 2 μm, and may be in a range from about 2 μm to about 40 μm. In some embodiments, top and bottom surfaces of the buffer layer 110 are also substantially planar. Thereafter, the thermal plate 180 is formed and patterned on the buffer layer 24. The thermal plate 180 may be made of a material including copper, silver, or gold.

Figure 5:
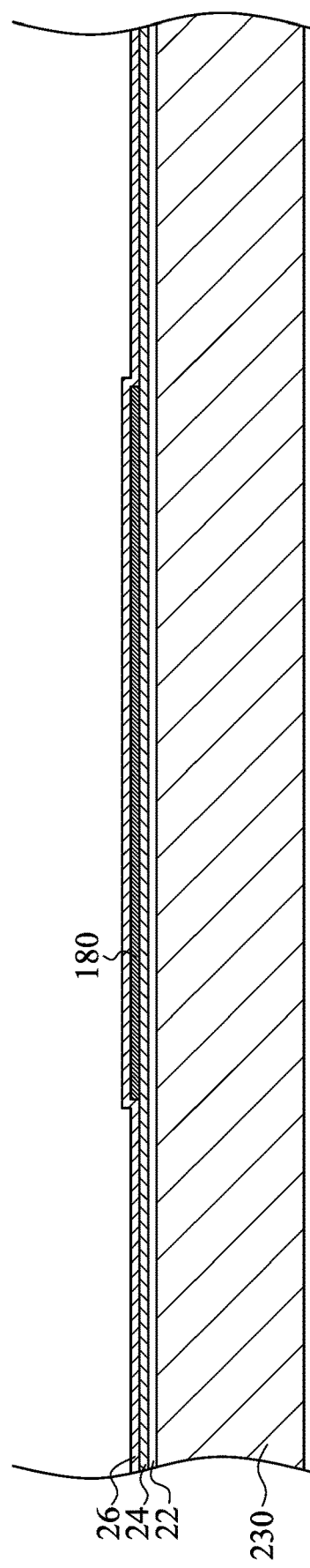

Referring to FIG. 5, a seed layer 26 is formed on the buffer layer 24 and the thermal plate 180, for example, through physical vapor deposition (PVD) or metal foil laminating. The seed layer 26 may include copper, copper alloy, aluminum, titanium, titanium alloy, or combinations thereof. In some embodiments, the seed layer 26 includes a titanium layer and a copper layer over the titanium layer. In alternative embodiments, the seed layer 26 is a copper layer.

Figure 6:
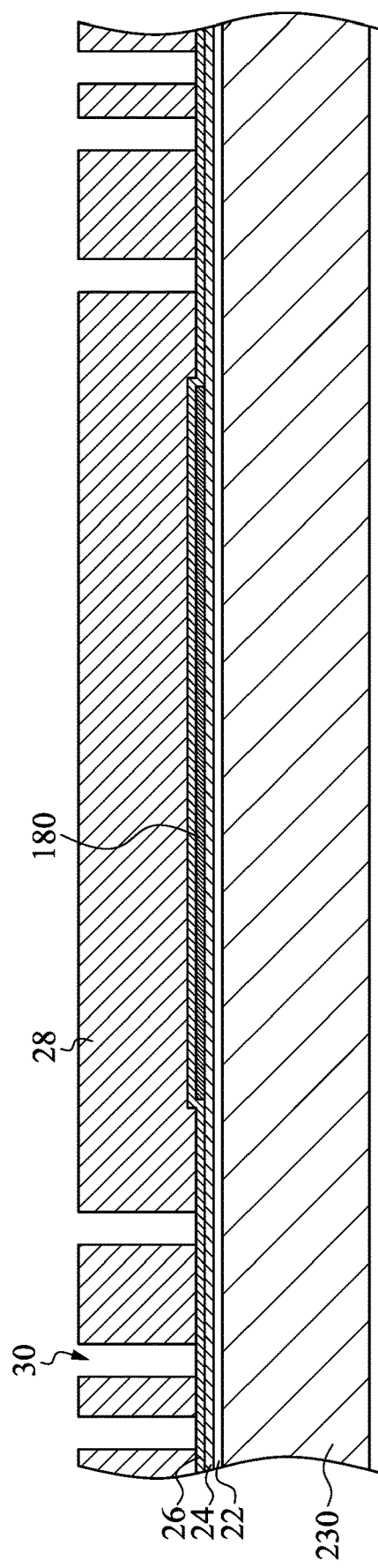

Referring to FIG. 6, a photo resist 28 is applied over the seed layer 26 and is then patterned. As a result, openings 30 are formed in the photo resist 28, through which some portions of the seed layer 26 are exposed.

Figure 7:
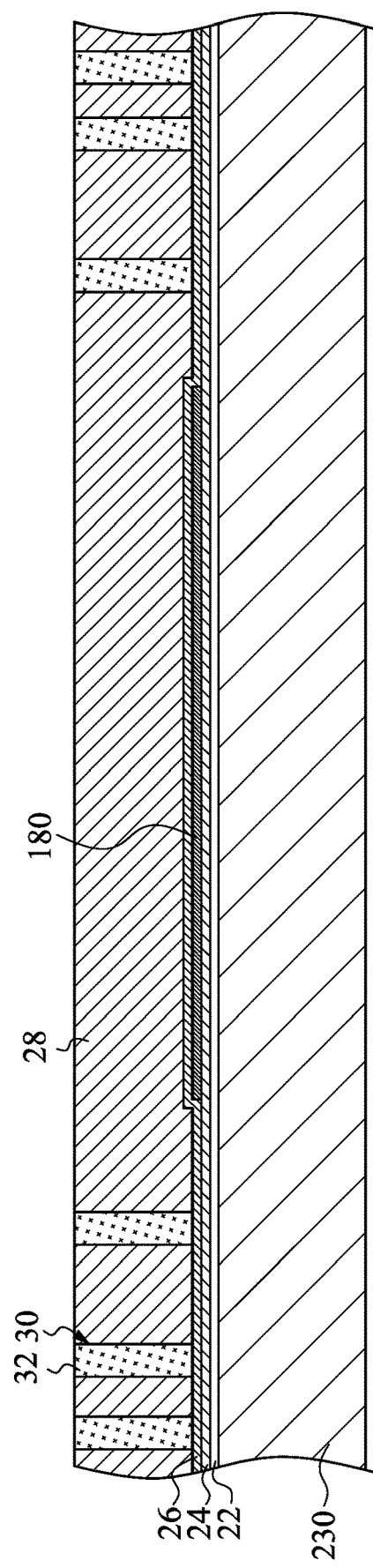
Figure 8:
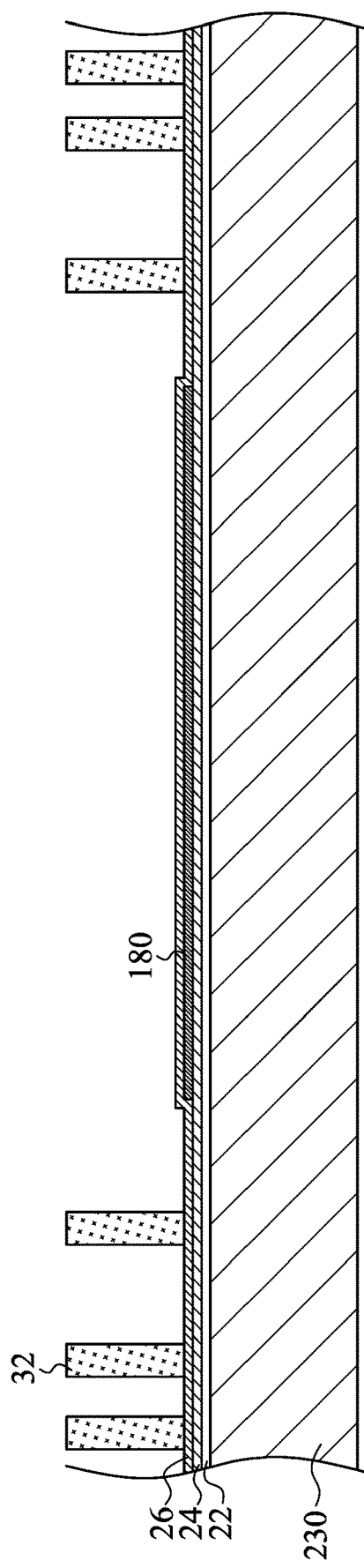

As shown in FIG. 7, conductive features 32 are formed in the photo resist 28 through plating, which may be electro plating or electro-less plating. The conductive features 32 are plated on the exposed portions of the seed layer 26. The conductive features 32 may include copper, aluminum, tungsten, nickel, solder, or alloys thereof. Heights of the conductive features 32 are determined by the thickness of the subsequently placed RF die 114 (FIG. 10), with the heights of the conductive features 32 greater than the thickness of the RF die 114 in some embodiments of the present disclosure. After the plating of the conductive features 32, the photo resist 28 is removed, and the resulting structure is shown in FIG. 8. After the photo resist 28 is removed, some portions of the seed layer 26 are exposed.

Figure 9:
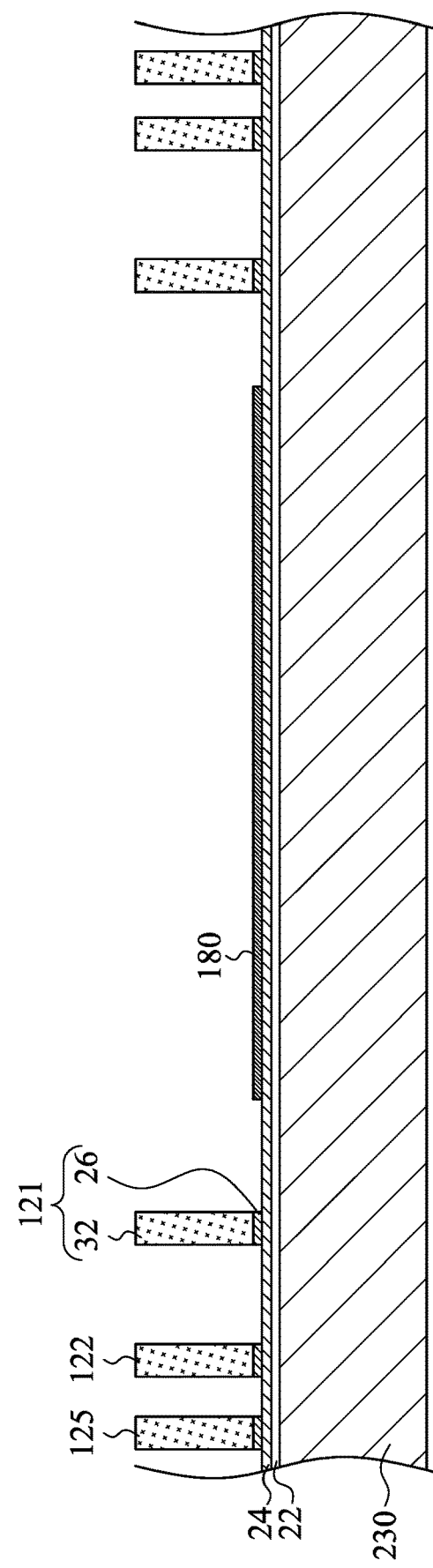

Referring to FIG. 9, an etch step is carried out to remove the exposed portions of the seed layer 26, in which the etch step may include an anisotropic etching. After the etch step, the thermal plate 180 is exposed. Some portions of the seed layer 26 that are covered by the conductive features 32, on the other hand, remain not etched. Throughout the description, the conductive features 32 and the remaining underlying portions of the seed layer 26 are in combination referred to as through integrated fan-out vias (TIVs) 121, which are also referred to as through-vias, in which some of the TIVs 121 are formed to be the conductors 122 and the directors 125 of the first antennas 120. Although the seed layer 26 is shown as a layer separate from the conductive features 32, when the seed layer 26 is made of a material similar to or substantially the same as the respective overlying conductive features 32, the seed layer 26 may be merged with the conductive features 32 with no distinguishable interface therebetween. In alternative embodiments, there exist distinguishable interfaces between the seed layer 26 and the overlying conductive features 32.

FIG. 10 illustrates placement of the RF die 114 over the thermal plate 180. The RF die 114 may be adhered to the thermal plate 180 through the thermal interface material 36. The RF die 114 may be a logic device die including logic transistors therein. The RF die 114 includes a semiconductor substrate (a silicon substrate, for example) that contacts the thermal interface material 36, in which the back surface of the RF die 114 is in contact with the thermal interface material 36.

In some embodiments, the conductive pillars 115 (such as copper posts) are formed as the top portions of the RF die 114, and are electrically coupled to the devices such as transistors (not shown) in the RF die 114. In some embodiments, a dielectric layer 38 is formed on the top surface of the RF die 114, with the conductive pillars 115 having at least lower portions in the dielectric layer 38. The top surface of the conductive pillars 115 may be substantially level with the top surfaces of the dielectric layer 38 in some embodiments. Alternatively, the dielectric layers are not formed, and the conductive pillars 115 protrude from a top dielectric layer (not shown) of the RF die 114.

Referring to FIG. 11, the molding compound 116 is molded on the RF die 114, the TIVs 121, the conductors 122, and the directors 125. The molding compound 116 fills gaps between the RF die 114, the TIVs 121, the conductors 122, and the directors 125, and may be in contact with the buffer layer 24. In addition, the molding compound 116 is filled into gaps between the conductive pillars 115 when the conductive pillars 115 are protruding conductive pillars 115 (this arrangement is not shown). The top surface of the molding compound 116 is higher than the top ends of the conductive pillars 115, the TIVs 121, the conductors 122, and the directors 125.

In some embodiments, the molding compound 116 includes a polymer-based material. The term "polymer" can represent thermosetting polymers, thermoplastic polymers, or combinations thereof. The polymer-based material can include, for example, plastic materials, epoxy resin, polyimide, polyethylene terephthalate (PET), polyvinyl chloride (PVC), polymethylmethacrylate (PMMA), polymer components doped with fillers including fiber, clay, ceramic, inorganic particles, or combinations thereof.

Figure 12:
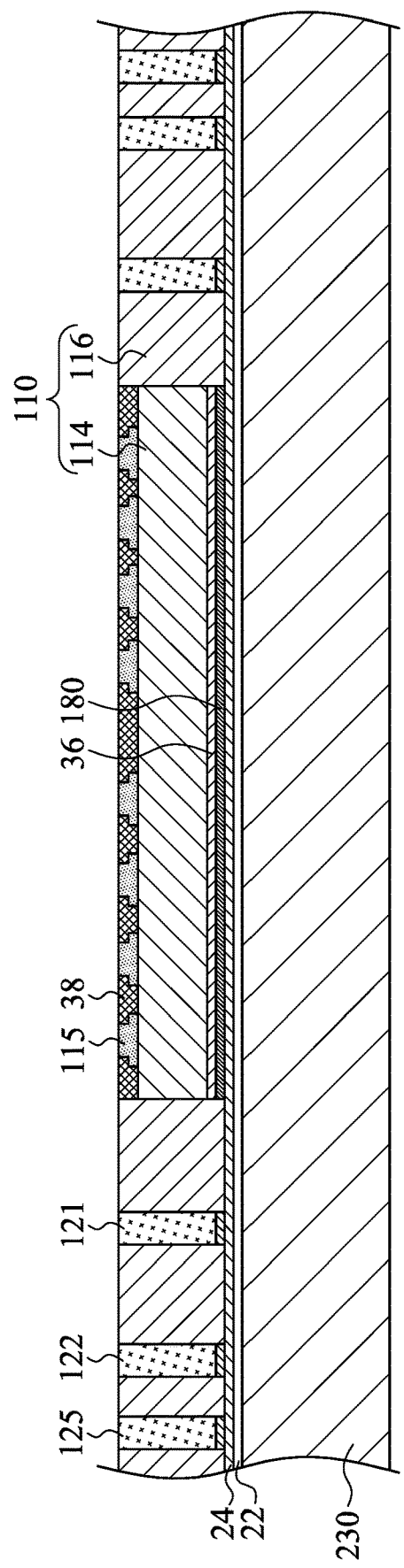

Next, a grinding step is carried out to thin the molding compound 116, until the conductive pillars 115, the TIVs 121, the conductors 122, and the directors 125 are exposed. The resulting structure is shown in FIG. 12, in which the molding compound 116 is in contact with sidewalls of the RF die 114, the TIVs 121, the conductors 122, and the directors 125. Due to the grinding, the top ends of the TIVs 121, the conductors 122, and the directors 125 are substantially level (coplanar) with the top ends of the conductive pillars 115, and are substantially level (coplanar) with the top surface of the molding compound 116. The thickness of the molding compound 116 and the thicknesses of the TIVs 121, the conductors 122, and the directors 125 are substantially the same. That is, the TIVs 121, the conductors 122, and the directors 125 extend through the molding compound 116. After the grinding, a cleaning may be carried out, for example, through a wet etching, so that conductive residues are removed.

Figure 13:
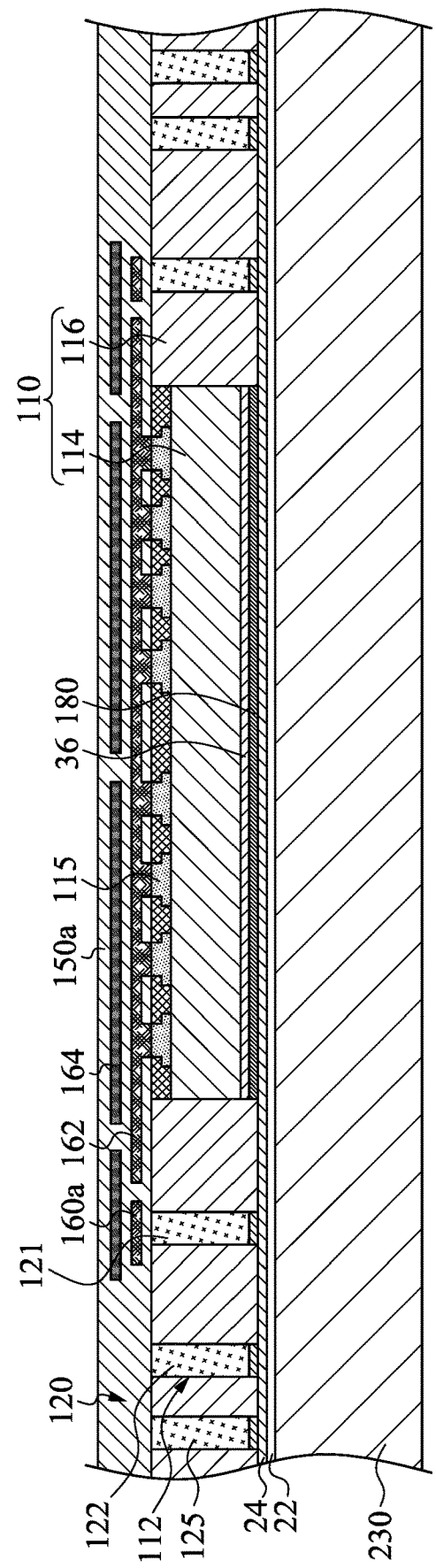

Next, referring to FIG. 13, the redistribution layer 160a, the feeding line 162, and the ground element 164 are formed over the molding compound 116. In accordance with various embodiments, the dielectric layer 150a is formed over the RF die 114, the molding compound 116, the TIVs 121, the conductors 122, and the directors 125, with the redistribution layer 160a, the feeding line 162, and the ground element 164 formed in the dielectric layer 150a. In some embodiments, the formation of the redistribution layer 160a, the feeding line 162, and the ground element 164 includes forming a first dielectric layer on the package 110, patterning the first dielectric layer, forming the redistribution layer 160a and the feeding line 162 on the patterned first dielectric layer, forming a second dielectric layer on the first dielectric layer, the redistribution layer 160a, and the feeding line 162, and forming the ground element 164 on the second dielectric layer. Thereafter, a third dielectric layer may be formed to cover the ground element 164 and the second dielectric layer. The combination of the first, second, and third dielectric layer forms the dielectric layer 150a of FIG. 13.

In some embodiments, the formation of the redistribution layer 160a, the feeding line 162, and the ground element 164 includes forming a blanket copper seed layer, forming and patterning a mask layer over the blanket copper seed layer, performing a plating to form the redistribution layer 160a, the feeding line 162, and the ground element 164, removing the mask layer, and performing a flash etching to remove the portions of the blanket copper seed layer not covered by the redistribution layer 160a, the feeding line 162, and the ground element 164. In alternative embodiments, the redistribution layer 160a, the feeding line 162, and the ground element 164 are formed by depositing at least one metal layer, patterning the metal layer, and filling gaps between the patterned metal layer with the dielectric layer 150a.

The redistribution layer 160a, the feeding line 162, and the ground element 164 may include a metal or a metal alloy including aluminum, copper, tungsten, and/or alloys thereof. The dielectric layer 150a in these embodiments may include a polymer such as polyimide, benzocyclobutene (BCB), polybenzoxazole (PBO), or the like. Alternatively, the dielectric layer 150a may include inorganic dielectric materials such as silicon oxide, silicon nitride, silicon carbide, silicon oxynitride, or the like.

Figure 15:
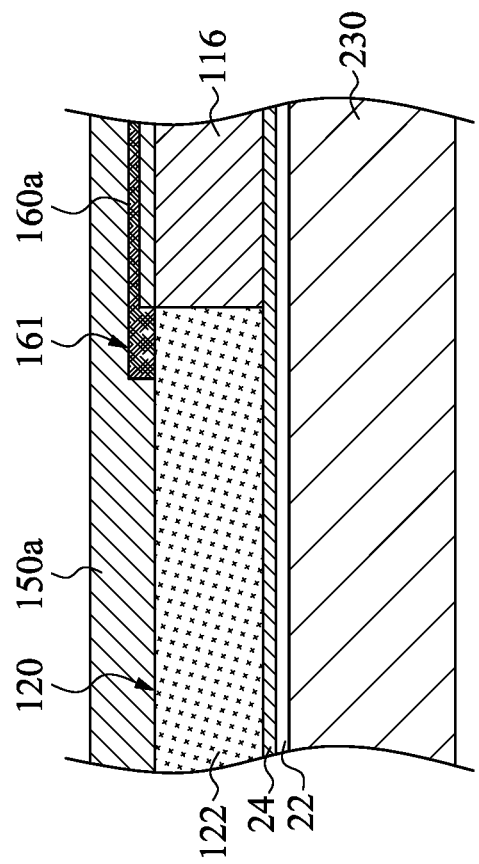
FIG. 15 is a cross-sectional view of the first antenna taken along line 15 of FIG. 14.
Figure 14:
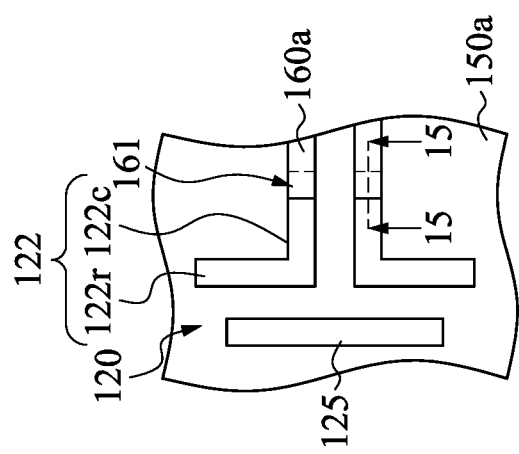
FIG. 14 is a top view of the first antenna of FIG. 13.
Figure 16:
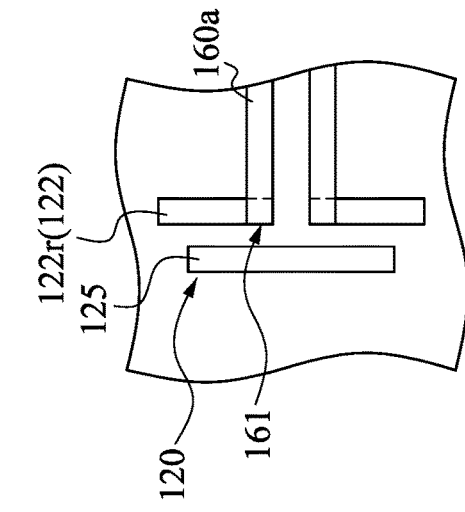
FIGS. 16-21 are top views of first antennas according to some embodiments of the present disclosure.
Figure 17:
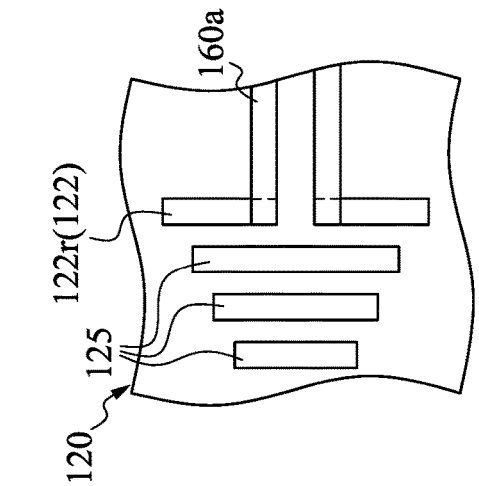

FIG. 14 is a top view of the first antenna 120 of FIG. 13. FIG. 15 is a cross-sectional view of the first antenna 120 taken along line 15 of FIG. 14. As shown in FIG. 14 and FIG. 15, the redistribution layers 160a are electrically connected to the connection elements 122c through conductive vias 161. In some embodiments, one director 125 is disposed adjacent to the radiating elements 122r, but various embodiments of the present disclosure are not limited in this regard. In alternative embodiments, as shown in FIG. 16, two directors 125 are disposed adjacent to the radiating elements 122r. In yet alternative embodiments, as shown in FIG. 17, no director is disposed adjacent to the radiating elements 122r.

Figure 18:
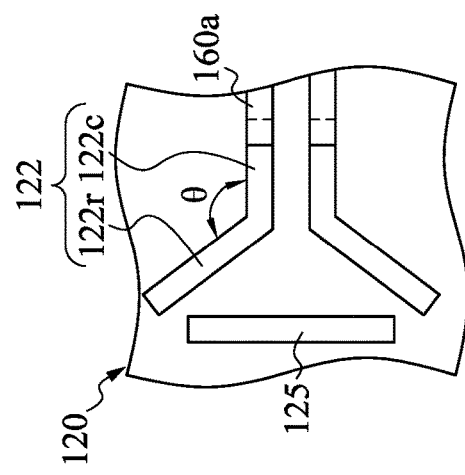
Figure 19:
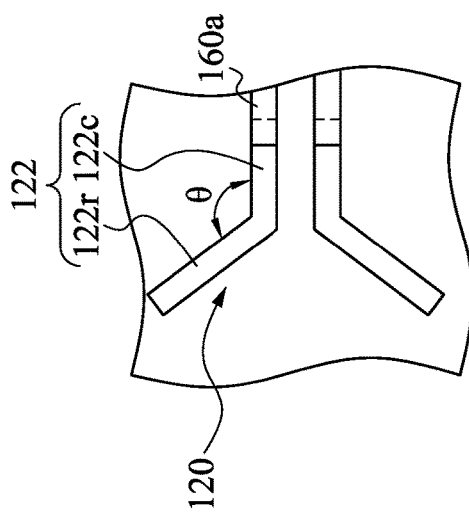

Reference is made to FIG. 18. In some embodiments, included angles θ between the radiating elements 122r and the connection elements 122c are greater than about 90 degrees. In some embodiments, the included angles θ is in a range from about 100 degrees to about 150 degrees, such as about 120 degrees, but various embodiments of the present disclosure are not limited in this regard. In some embodiments, one director 125 is present adjacent to the radiating elements 122r, but various embodiments of the present disclosure are not limited in this regard. In alternative embodiments, as shown in FIG. 19, no director is disposed adjacent to the radiating elements 122r.

Figure 20:
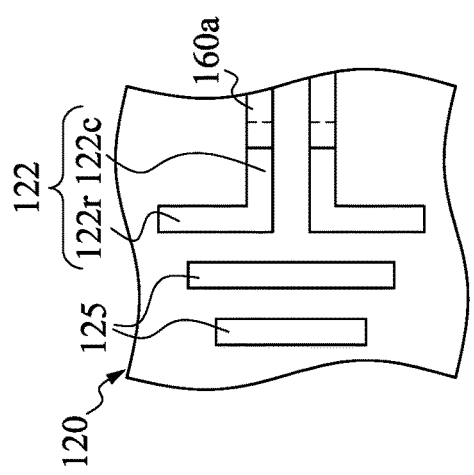
Figure 21:
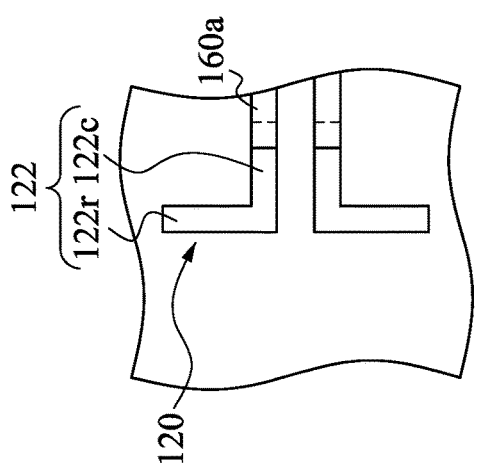

As shown in FIG. 20, in some embodiments, the connection elements 122c are absent from the conductors 122, and the redistribution layers 160a are electrically connected to the radiating elements 122r at end portions of the radiating elements 122r. Each of the conductors 122 shown in FIG. 20 may have a straight top shape. In some embodiments, one director 125 is present adjacent to the radiating elements 122r, but various embodiments of the present disclosure are not limited in this regard. In alternative embodiments, as shown in FIG. 21, three directors 125 are present adjacent to the radiating elements 122r.

Figure 22:
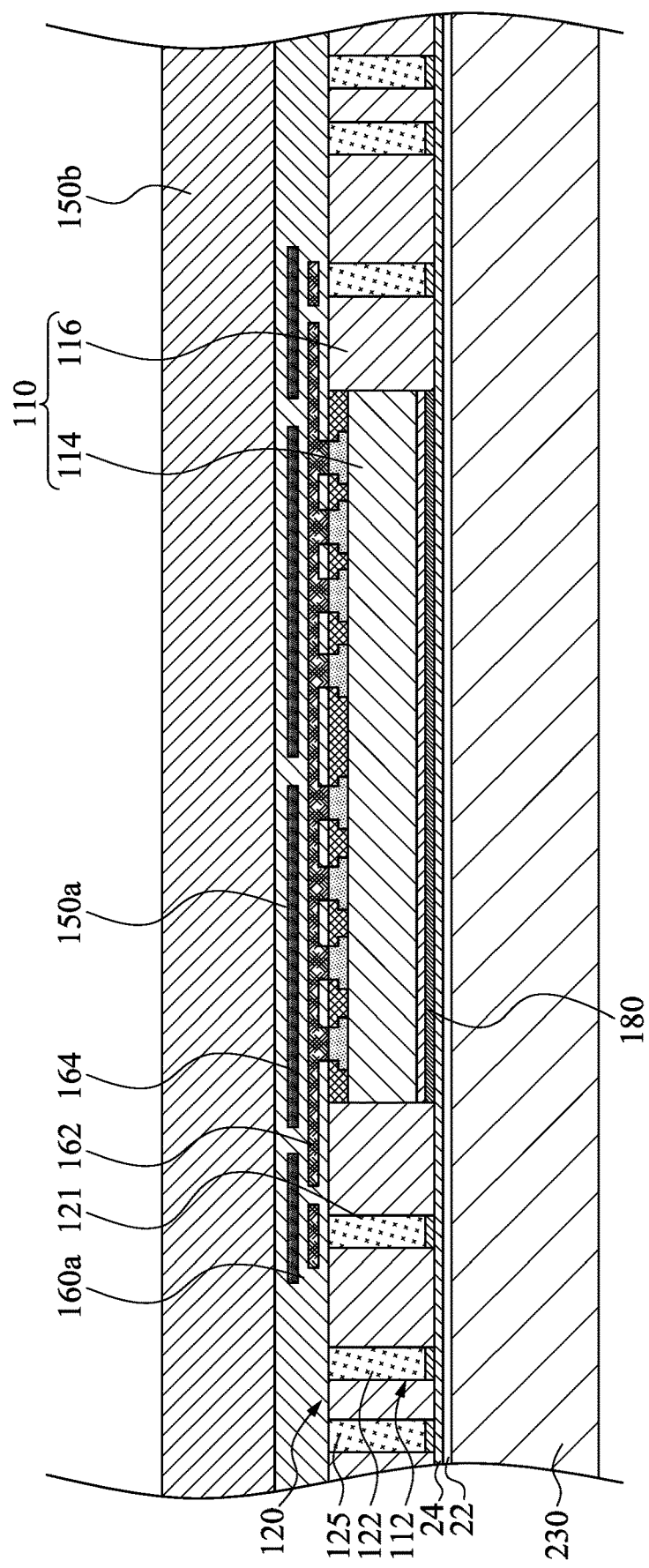
FIGS. 22-26 are cross-sectional views of the method for manufacturing the antenna device after the step of FIG. 13.

Referring to FIG. 22, the dielectric layer 150b is formed on the dielectric layer 150a. In some embodiments, the dielectric layer 150b is molded on the dielectric layer 150a and then is ground to thin the dielectric layer 150b. The dielectric layer 150b may include a molding compound, such as plastic materials, epoxy resin, polyimide, polyethylene terephthalate (PET), polyvinyl chloride (PVC), polymethylmethacrylate (PMMA), polymer components doped with fillers including fiber, clay, ceramic, inorganic particles, or combinations thereof.

Figure 23:
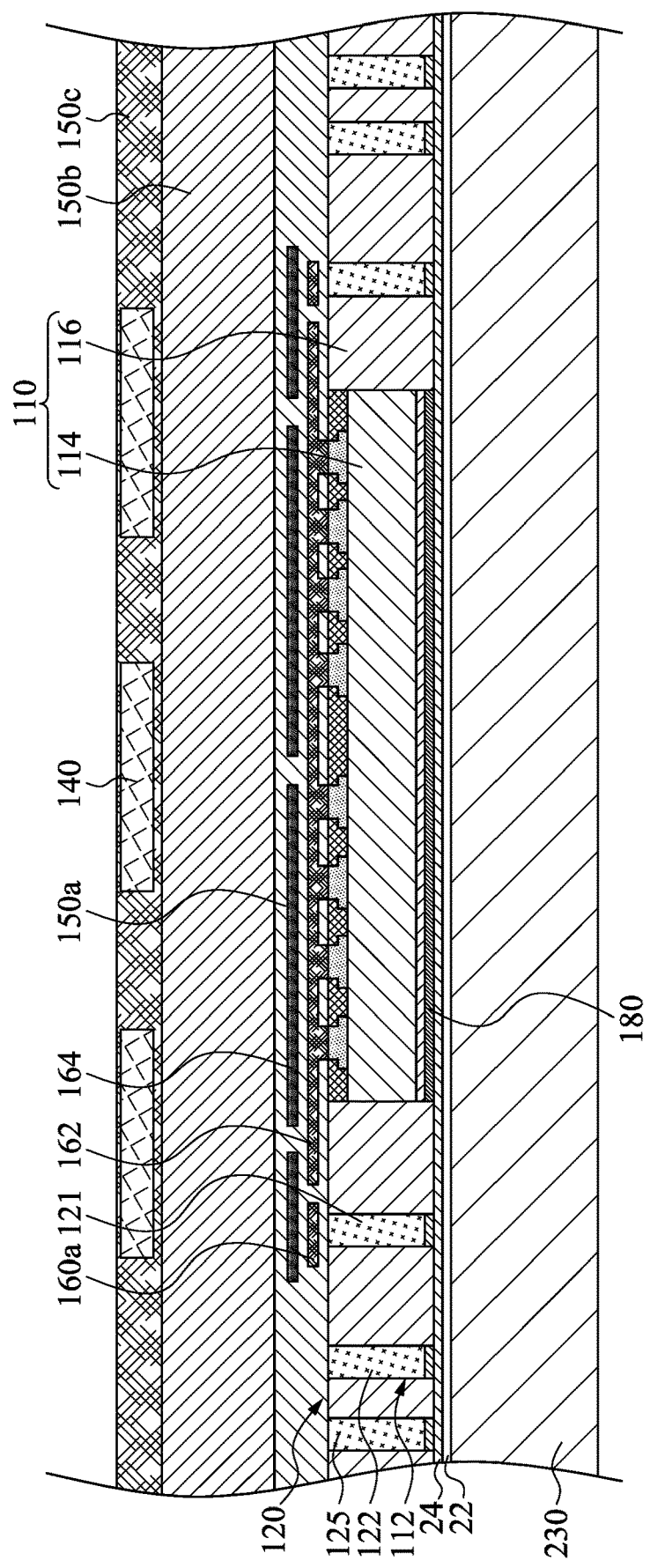

Referring to FIG. 23, the dielectric layer 150c with the radiating elements 140 therein is formed on the dielectric layer 150b, such that the dielectric layer 150b is present between the dielectric layer 150a and the dielectric layer 150c. As a result, the radiating elements 140 are present above the RF die 114 and the molding compound 116, and the radiating elements 140, the ground element 164, and the feeding line 162 may function as patch antennas. In some embodiments, the radiating elements 140 may be formed by electroplating or deposition, but various embodiments of the present disclosure are not limited in this regard.

Figure 24:
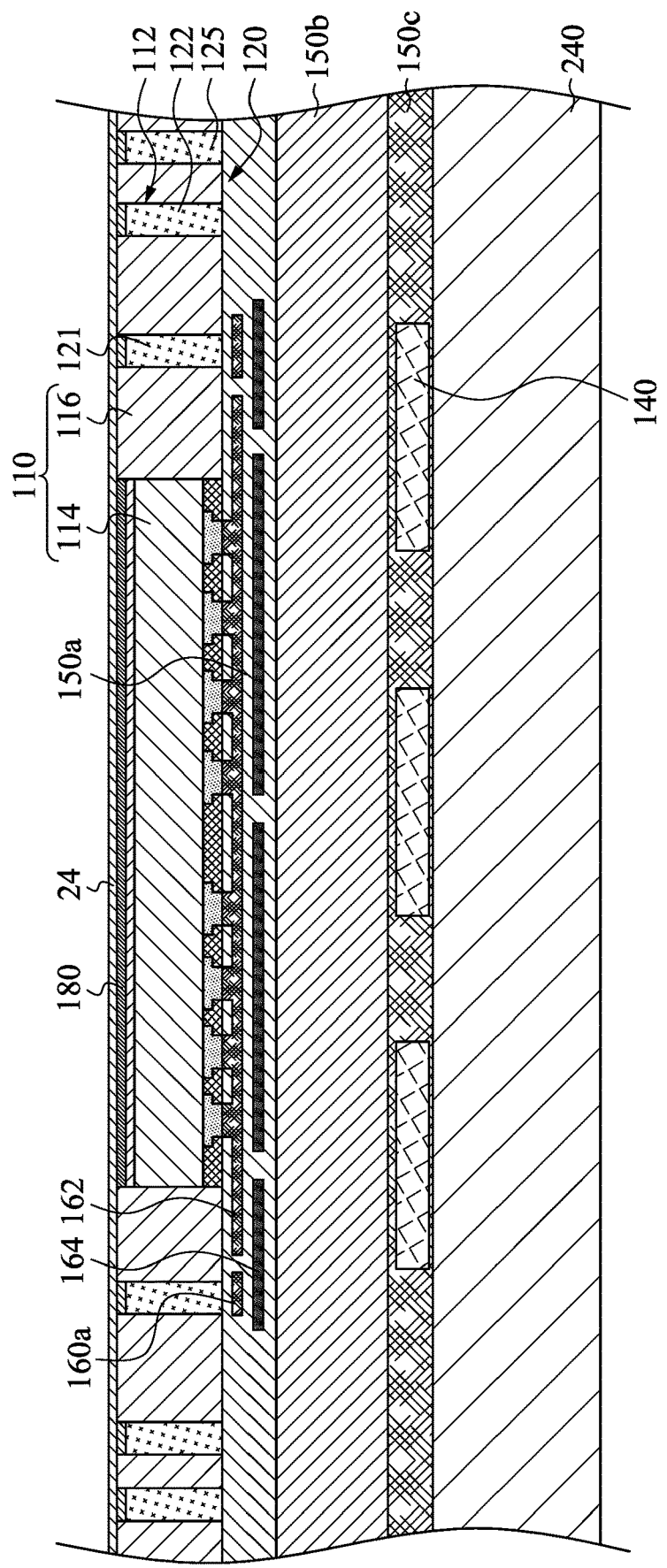

Referring to FIG. 23 and FIG. 24, after the radiating elements 140 and the dielectric layer 150c are formed on the dielectric layer 150b, the package 110 is de-bonded from the carrier 230. The adhesive layer 22 is also cleaned from the package 110. Thereafter, the structure de-bonded from the carrier 230 is further adhered to another carrier 240, in which the dielectric layer 150c faces toward, and may contact, the carrier 240.

Figure 25:
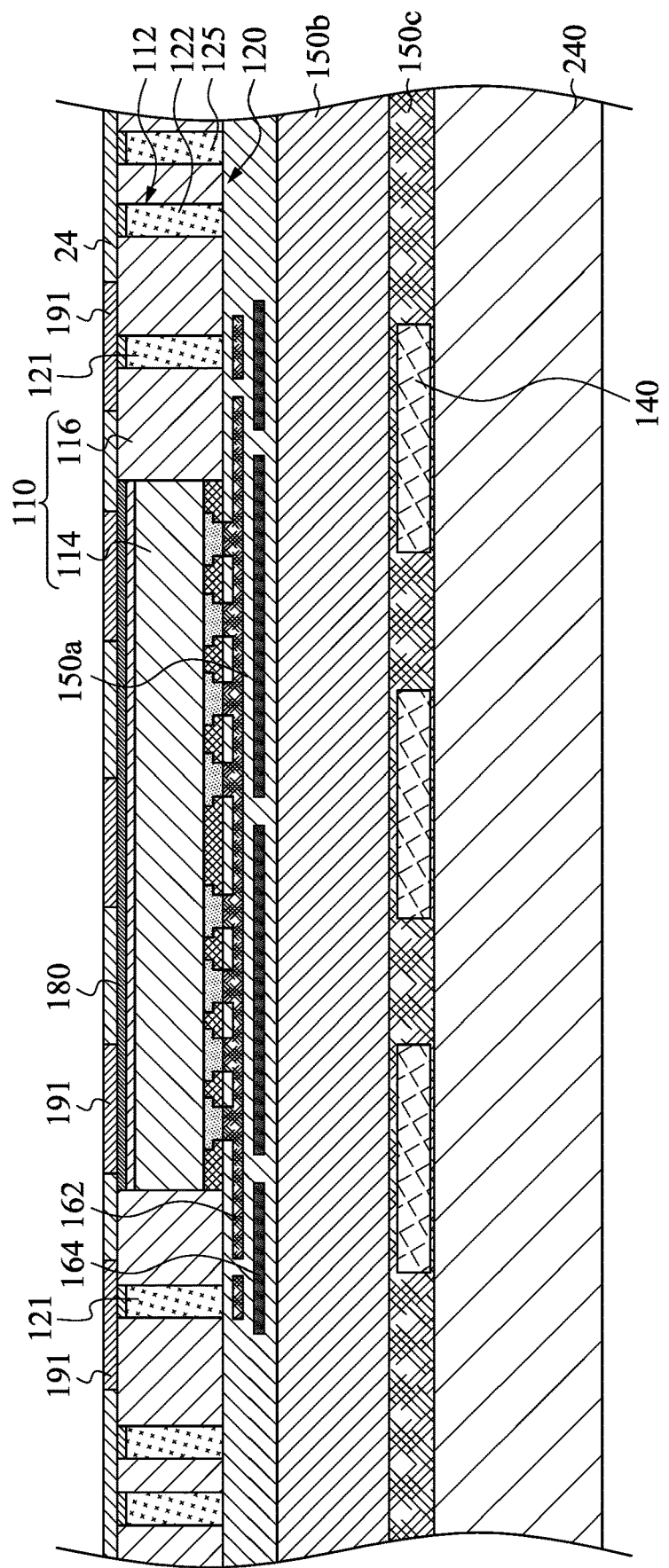

Referring to FIG. 25, openings are formed in the buffer layer 24, and then the UBM layer 191 is optionally formed in the openings of the buffer layer 24. In some embodiments, some portions of the UBM layer 191 are formed on the thermal plate 180, and some portions of the UBM layer 191 are formed on the TIVs 121. In accordance with some embodiments, the openings are formed in the buffer layer 24 through laser drill, although photolithography processes may also be used.

Figure 26:
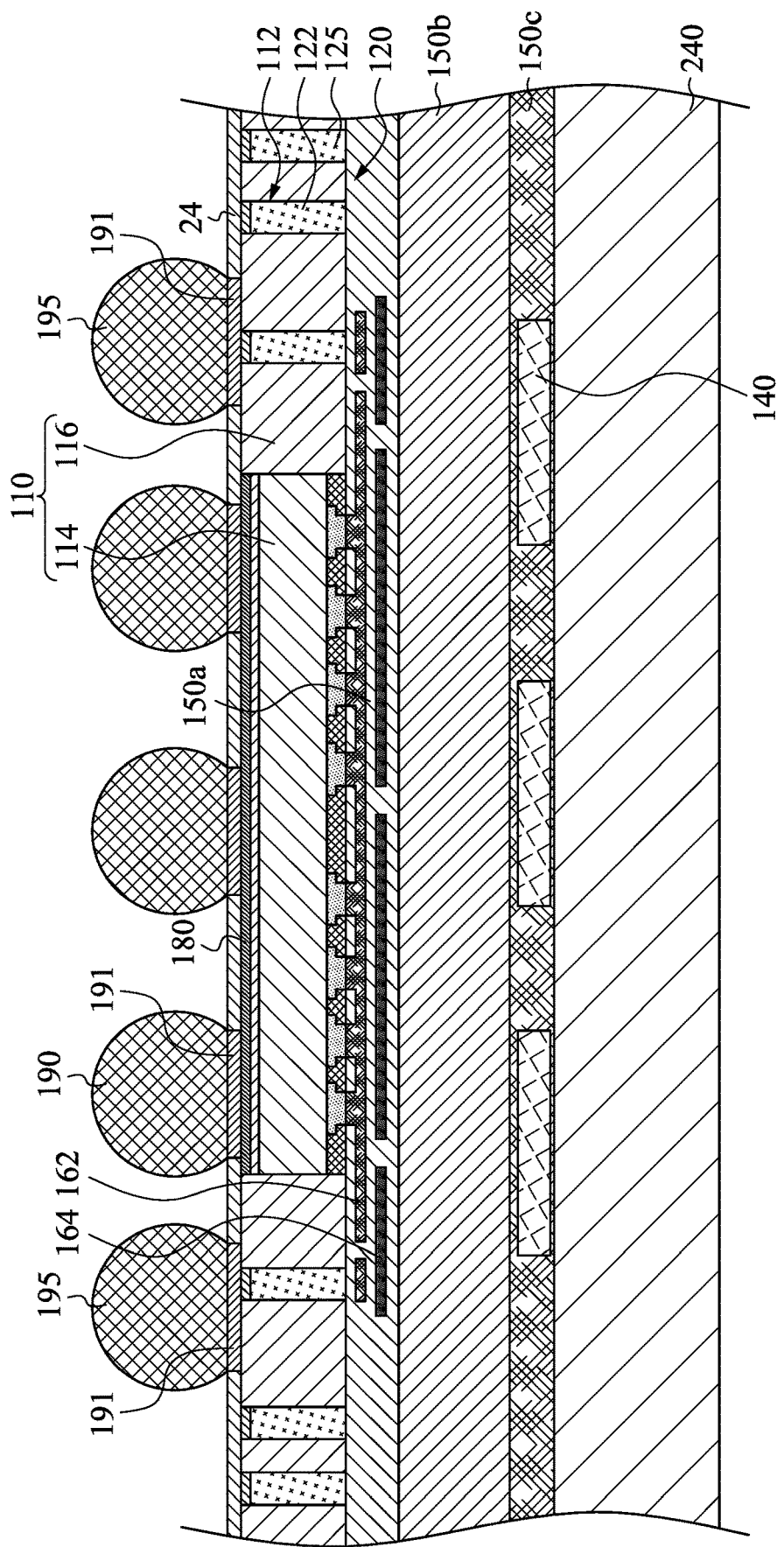

Next, referring to FIG. 26, the thermally conductive bumps 190 and the electrical connectors 195 are formed on the UBM layer 191. Formation of the thermally conductive bumps 190 and the electrical connectors 195 may include placing solder balls on the UBM layer 191 (or the exposed thermal plate 180 and TIVs 121 (if the UBM layer 191 is not formed), and then reflowing the solder balls.

After the thermally conductive bumps 190 and the electrical connectors 195 are formed, the carrier 240 is removed, and a singulation process is carried out to saw the structure of FIG. 26, such that at least one antenna device 100 of FIG. 2 is formed.

Figure 27:
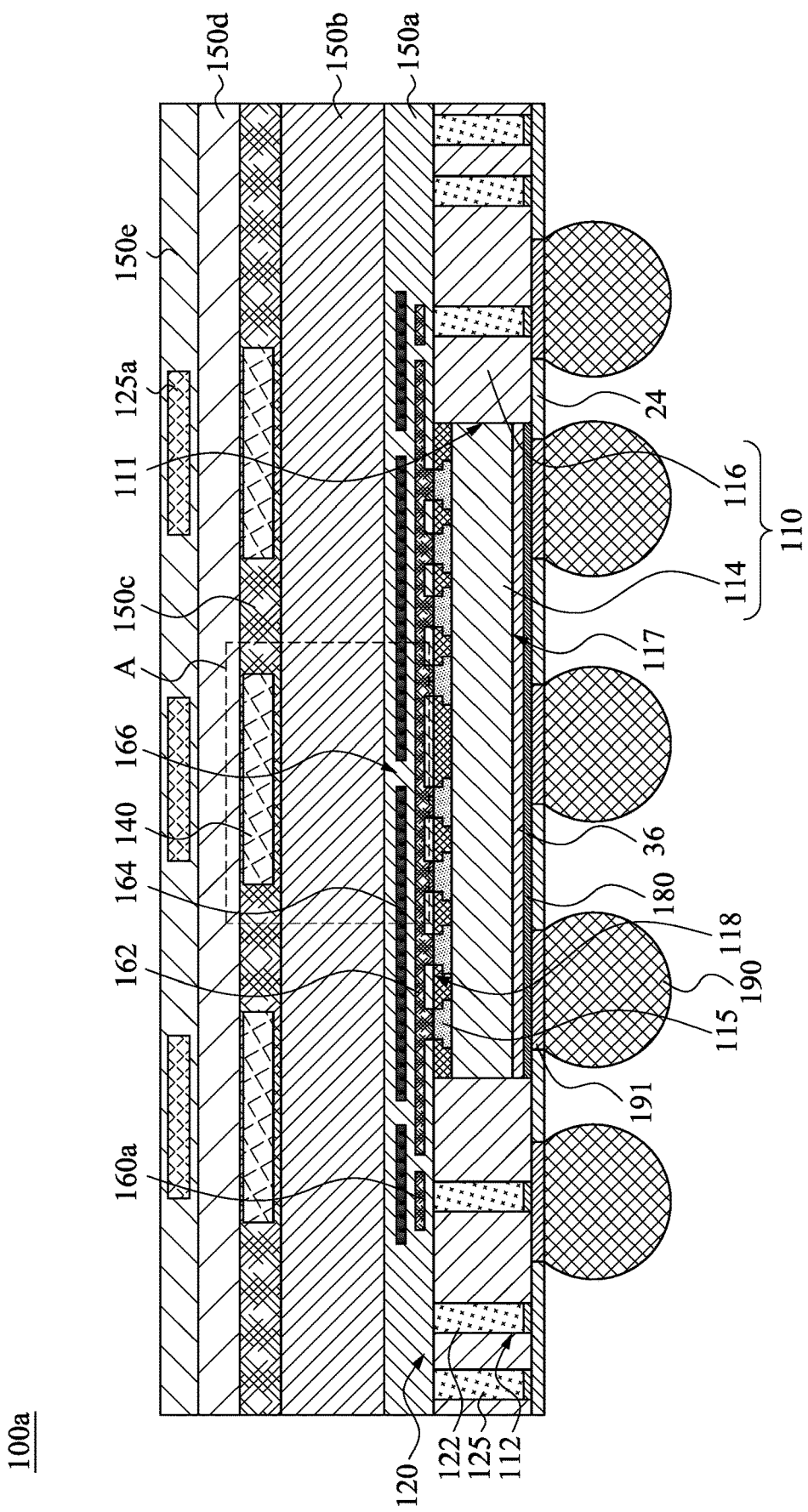
FIG. 27 is a cross-sectional view of an antenna device according to some embodiments of the present disclosure.

FIG. 27 is a cross-sectional view of an antenna device 100a according to some embodiments of the present disclosure. In some embodiments, the antenna device 100a further includes dielectric layers 150d, 150e and at least one director 125a. The dielectric layer 150d is present over the dielectric layer 150c and the radiating element 140, and the dielectric layer 150e is present over the dielectric layer 150d. The director 125a is present in the dielectric layer 150e and overlaps with the radiating element 140. The director 125a may increase the gain of the patch antenna (e.g., the area A including the feeding line 162, the ground element 164, and the radiating element 140) at high frequency. In some embodiments, the dielectric layer 150d may be made of a dielectric material, such as low dissipation factor (Df) materials, glass, organic materials, or the like. In some alternative embodiments, the dielectric layer 150d is made of a molding compound.

Figure 28:
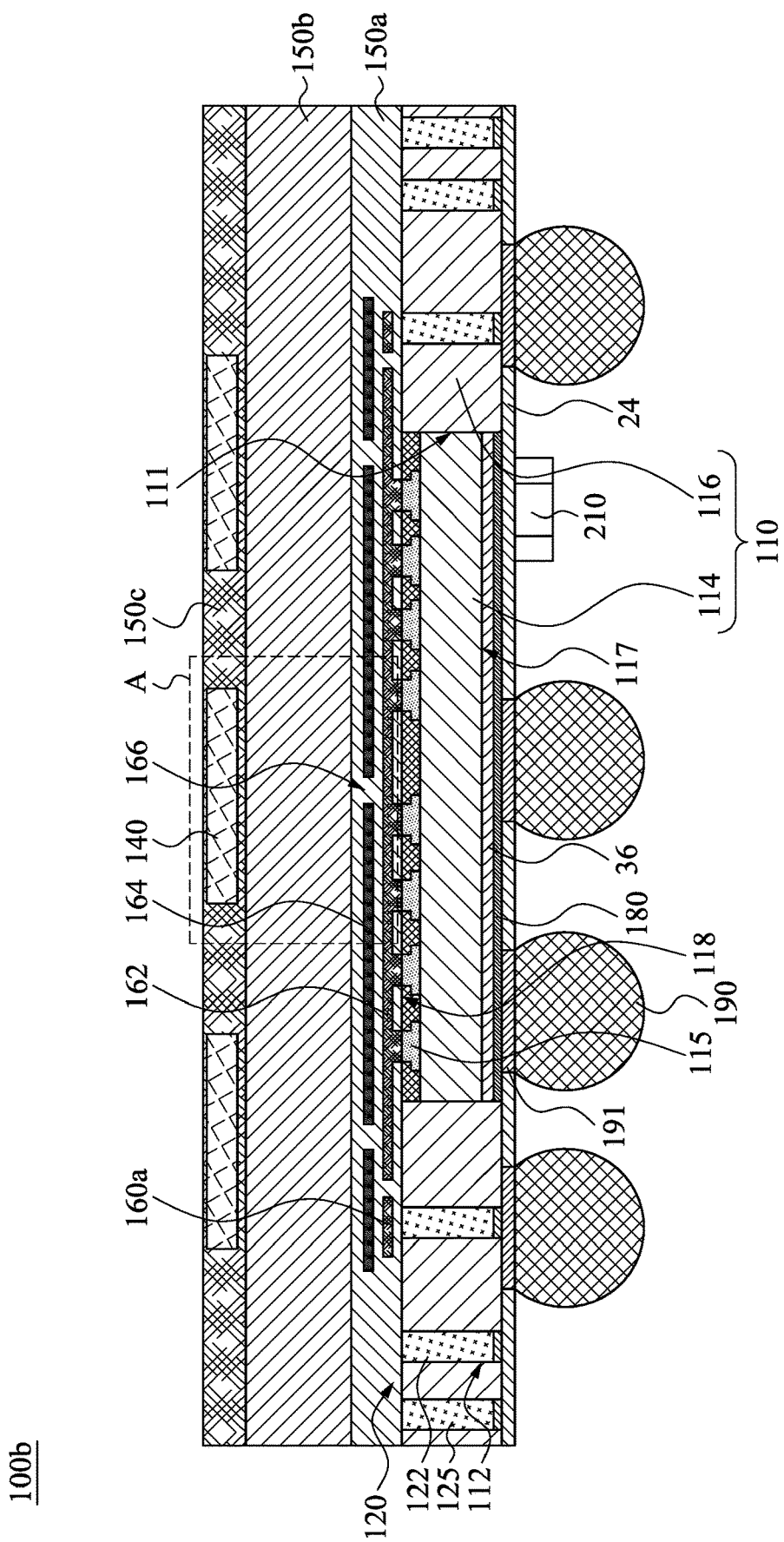
FIG. 28 is a cross-sectional view of an antenna device according to some embodiments of the present disclosure.

FIG. 28 is a cross-sectional view of an antenna device 100b according to some embodiments of the present disclosure. The antenna device 100b further includes a surface-mount device 210 (SMD). The surface-mount device 210 is disposed on the buffer layer 24. In some embodiments, the thermal plate 180 is present above the surface-mount device 210. The surface-mount device 210 may be a passive component, such as a resistor, a capacitor, or an inductor, but various embodiments of the present disclosure are not limited in this regard.

Figure 29:
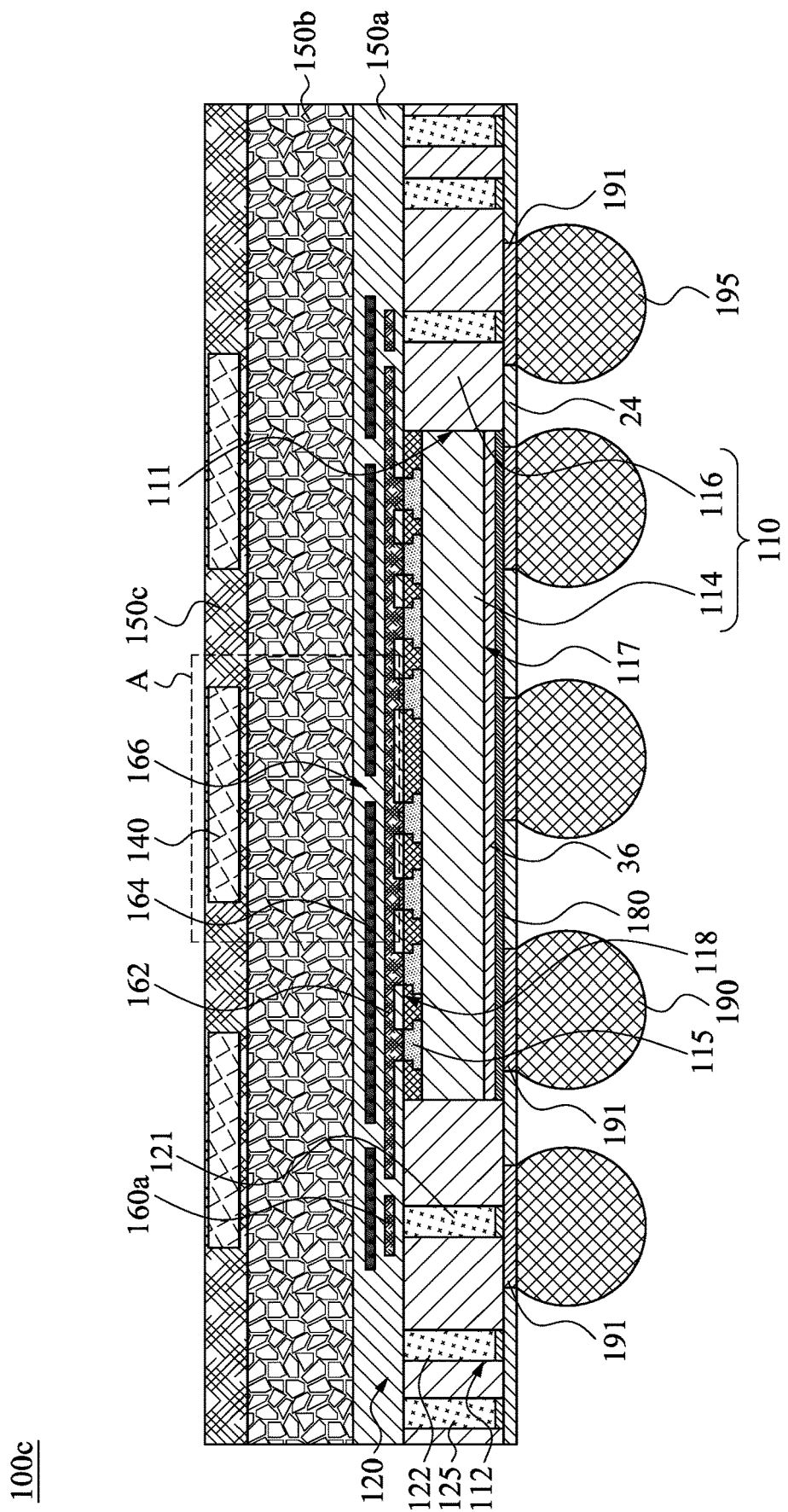
FIG. 29 is a cross-sectional view of an antenna device according to some embodiments of the present disclosure.

FIG. 29 is a cross-sectional view of an antenna device 100c according to some embodiments of the present disclosure. In some embodiments, the dielectric layer 150b is not made of a molding compound. That is, the dielectric layer 150b and the molding compound 116 are made of different materials. The dielectric layer 150b may be made of, for example, low dissipation factor (Df) materials, glass, organic materials, or the like. In some embodiments, the dissipation factor of the dielectric layer 150b is smaller than about 0.01, but various embodiments of the present disclosure are not limited in this regard.

Figure 30:
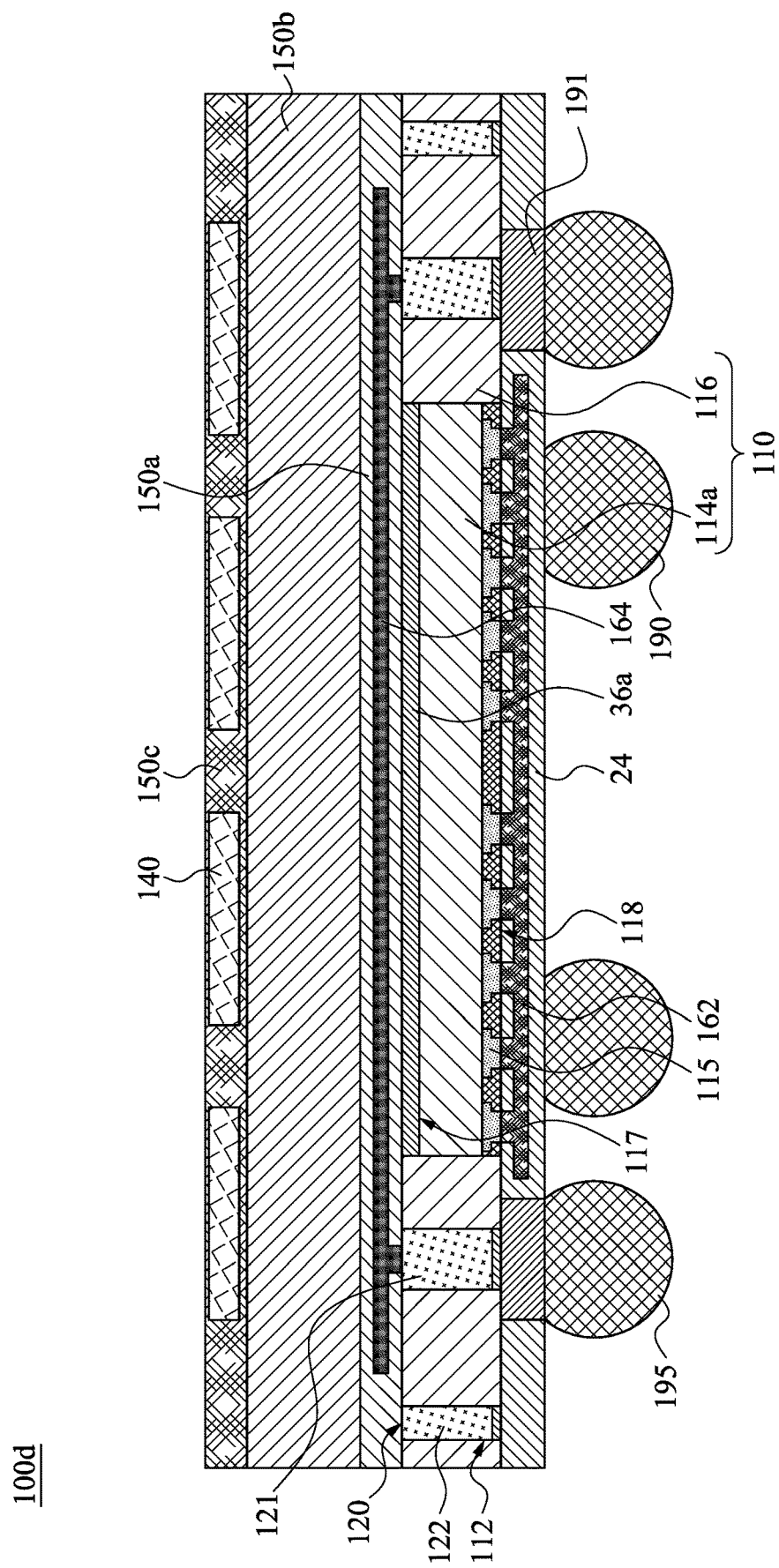
FIG. 30 is a cross-sectional view of an antenna device according to some embodiments of the present disclosure.

FIG. 30 is a cross-sectional view of an antenna device 100d according to some embodiments of the present disclosure. The RF die 114a shown in FIG. 30 faces away from the dielectric layer 150a. That is, the lower surface 118 is the front side of the RF die 114a. The thermal interface material 36a is disposed on the surface 117 of the RF die 114a facing the dielectric layer 150a. In some embodiments, the ground element 164 in the dielectric layer 150a may be used as a thermal plate to expand thermal spreading area, and heat generated from the RF die 114a may transfer to the ground element 164 through the thermal interface material 36a and then further transfer to the electrical connectors 195 through the TIVs 121 and the UBM layer 191.

Figure 31:
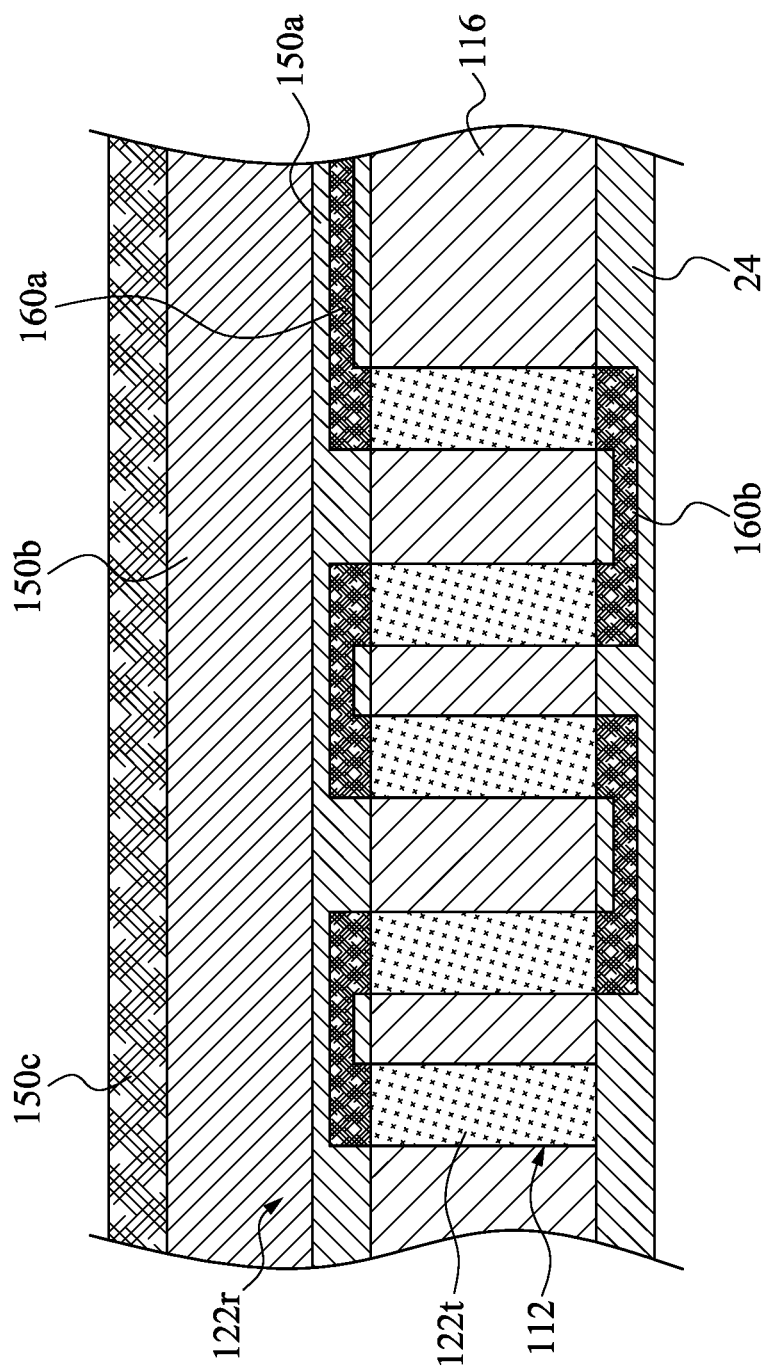
FIG. 31 is a partially cross-sectional view of a radiating element according to some embodiments of the present disclosure.

FIG. 31 is a partially cross-sectional view of a radiating element 122r according to some embodiments of the present disclosure. In some embodiments, the radiating element 122r includes plural TIVs 122t, plural sections of the redistribution layer 160a, and plural sections of redistribution layer 160b. The TIVs 122t are interconnected by the sections of the redistribution layer 160a and the sections of the redistribution layer 160b to form the radiating element 122r. As a result of such a configuration, a top view size of the radiating element 122r may be reduced because the radiating element 122r has at least the TIVs 122t longitudinally extending through the molding compound 116.

Figure 32:
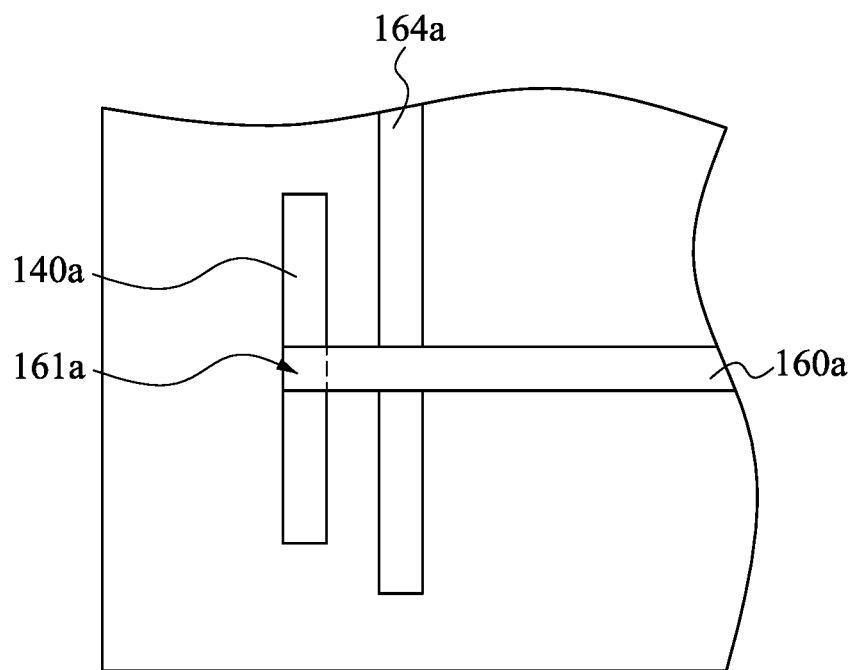
FIG. 32 is a top view of a redistribution layer, a ground element, and a radiating element according to some embodiments of the present disclosure.
Figure 33:
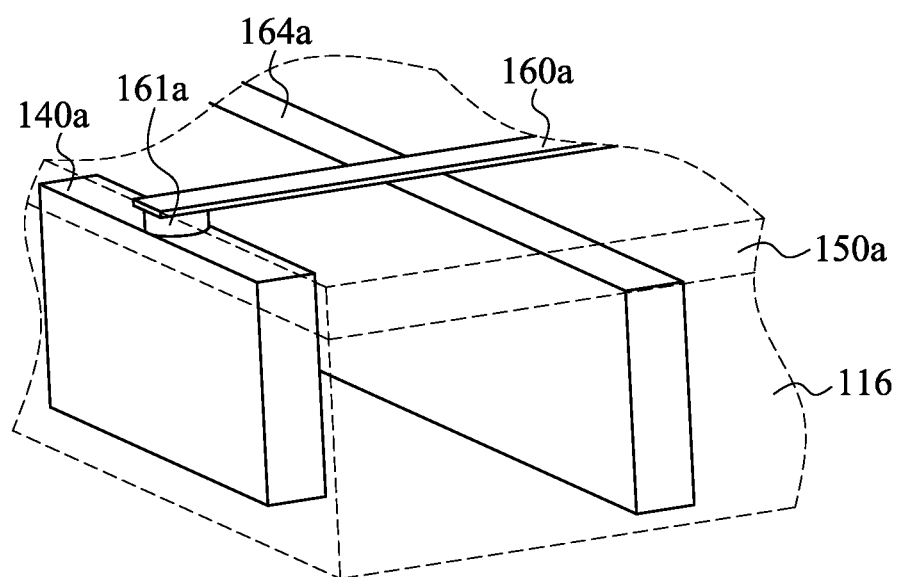
FIG. 33 is a perspective view of the redistribution layer, the ground element, and the radiating element of FIG. 32.

In some embodiments, the second antenna, e.g. the patch antenna, is at least partially formed in molding compound 116 as well. FIG. 32 is a top view of the redistribution layer 160a, the ground element 164a, and the radiating element 140a according to some embodiments of the present disclosure. FIG. 33 is a perspective view of the redistribution layer 160a, the ground element 164a, and the radiating element 140a of FIG. 32. As shown in FIGS. 32 and 33, the radiating element 140a and the ground element 164a are conductive walls in the molding compound 116, and the top-view shape of the ground element 164a and the top-view shape of the radiating element 140a are straight. The radiating element 140a and the ground element 164a are separated by at least a portion of the molding compound 116. The redistribution layer 160a is electrically connected to the radiating element 140a through a via 161a. As a result of such a configuration, the radiating element 140a and the ground element 164a in the molding compound 116 may function as a patch antenna. In some embodiments, the radiating element 140a may be substantially parallel with the ground element 164a, but various embodiments of the present disclosure are not limited in this regard.

Figure 34:
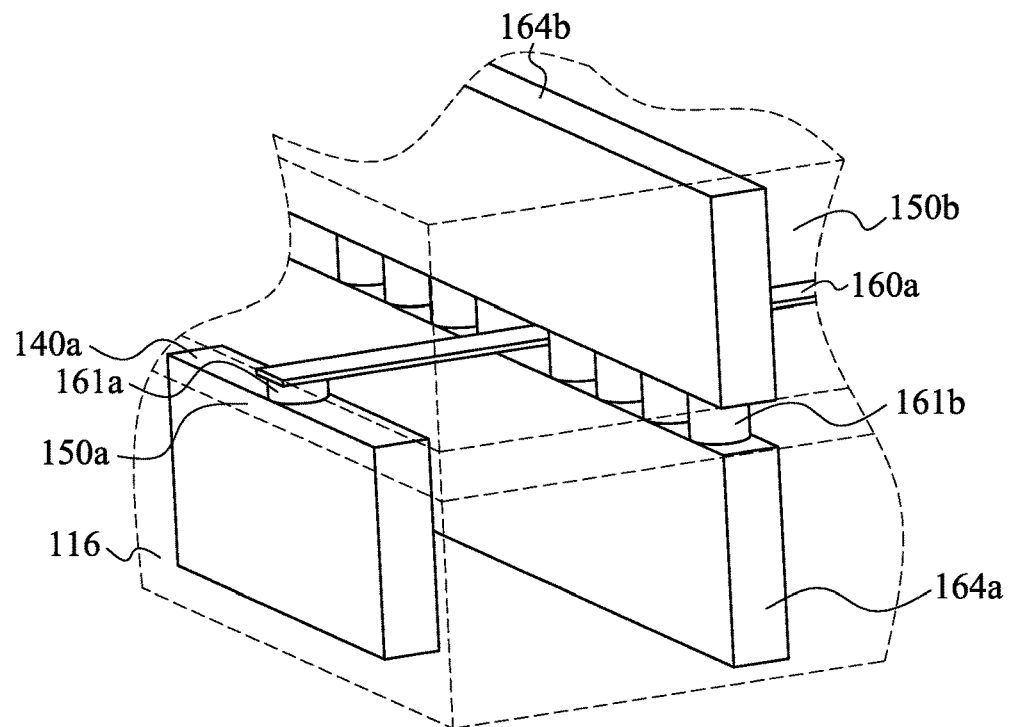
FIG. 34 is a perspective view of a redistribution layer, a ground element, and a radiating element according to some embodiments of the present disclosure.

In some embodiments, as shown in FIG. 34, another ground element 164b is formed in the dielectric layer 150b. The ground element 164b is electrically connected to the ground element 164a through vias 161b in the dielectric layer 150a.

Figure 35:
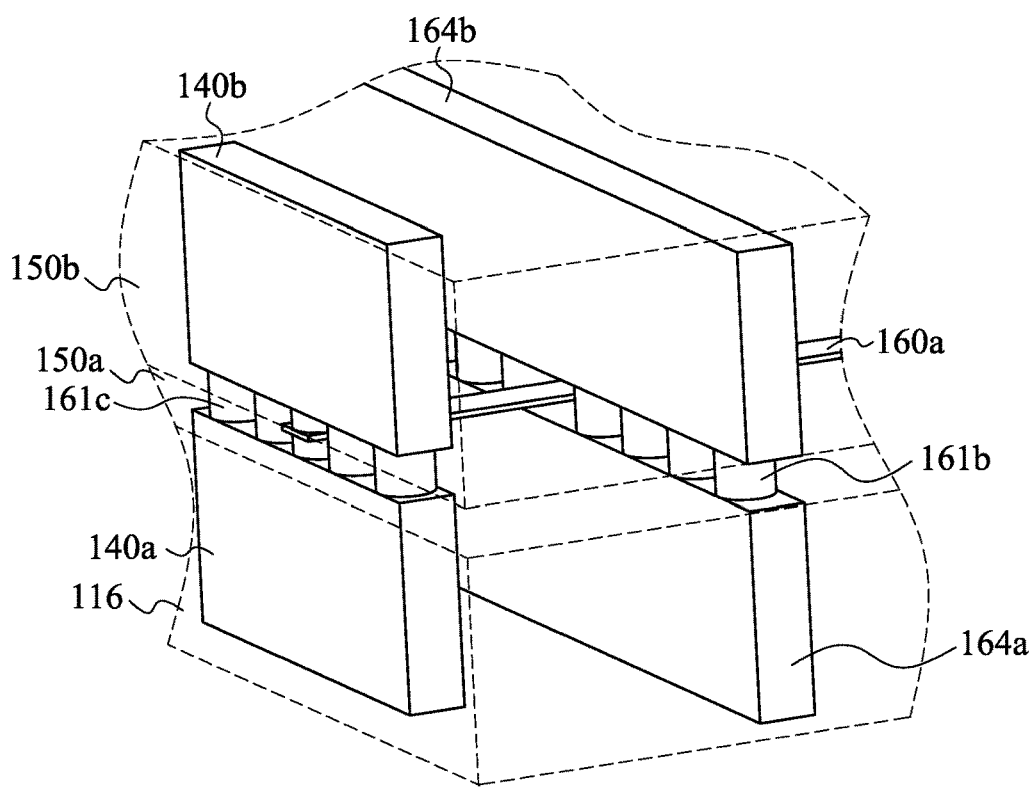
FIG. 35 is a perspective view of a redistribution layer, a ground element, and a radiating element according to some embodiments of the present disclosure.

In some embodiments, as shown in FIG. 35, another radiating element 140b is formed in the dielectric layer 150b. The radiating element 140b is electrically connected to the radiating element 140a through vias 161c in the dielectric layer 150a.

Figure 36:
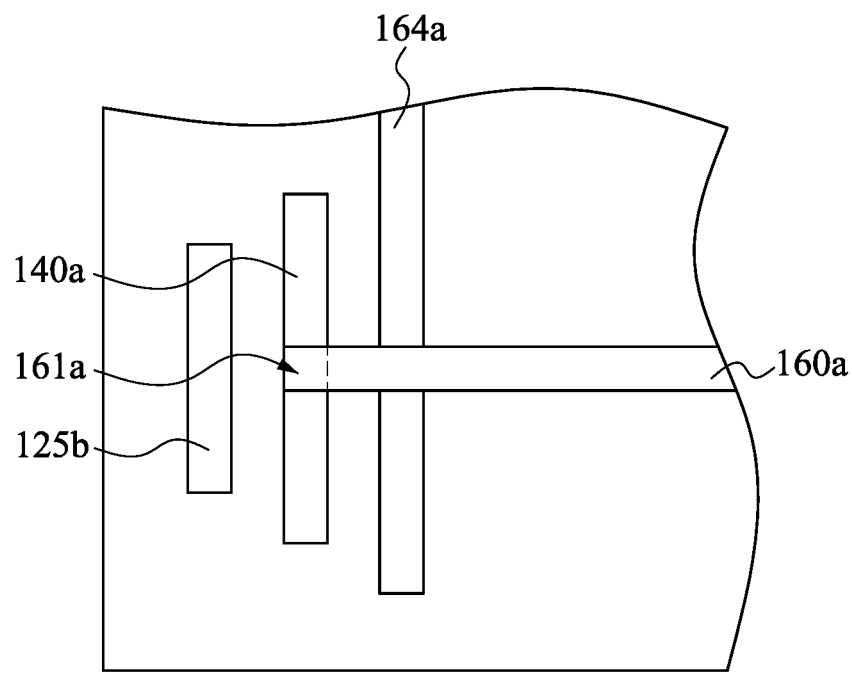
FIG. 36 is a top view of a redistribution layer, a ground element, a radiating element, and a director according to some embodiments of the present disclosure.
Figure 37:
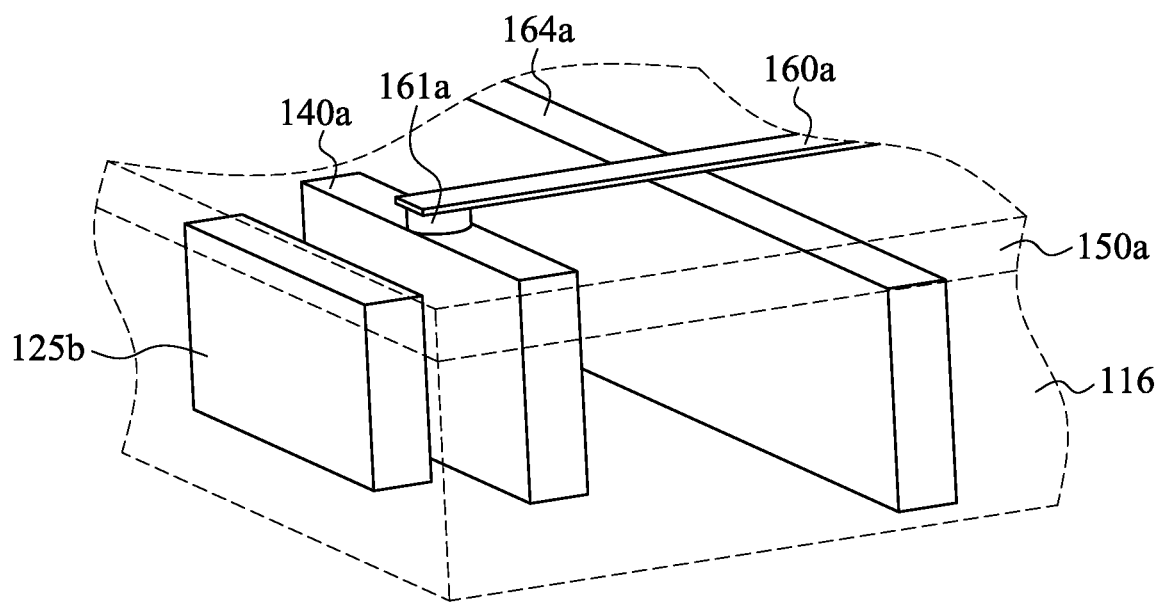
FIG. 37 is a perspective view of the redistribution layer, the ground element, the radiating element, and the director of FIG. 36.

In some embodiments, the second antenna has at least one director present adjacent to the radiating element 140a. FIG. 36 is a top view of the redistribution layer 160a, the ground element 164a, the radiating element 140a, and the director 125b according to some embodiments of the present disclosure. FIG. 37 is a perspective view of the redistribution layer 160a, the ground element 164a, the radiating element 140a, and the director 125b of FIG. 36. In some embodiments, as shown in FIGS. 36 and the FIG. 37, the director 125b is present adjacent to the radiating element 140a, in which the radiating element 140a is present between the director 125b and the ground element 164a. The director 125b is a conductive wall in the molding compound 116, and the top-view shape of the director 125b may be, for example, straight. The director 125b may increase the gain of the second antenna at high frequency. In some embodiments, one director 125b is disposed adjacent to the radiating element 140a, but various embodiments of the present disclosure are not limited in this regard. In alternative embodiments, two or more directors are disposed adjacent to the radiating element 140a.

In the embodiments of the present disclosure, by at least partially embedding the antenna in the molding compound, the antenna can have at least one thick portion. The thick portion of the antenna can increase the efficiency and bandwidth of the antenna.

In accordance with some embodiments of the present disclosure, an antenna device includes a package, a radiating element, and a director. The package includes a radio frequency (RF) die and a molding compound in contact with a sidewall of the RF die. The radiating element is in the molding compound and electrically coupled to the RF die. The director is in the molding compound, wherein the radiating element is between the director and the RF die, and a top of the radiating element is substantially coplanar with a top of the director.

In accordance with some embodiments of the present disclosure, an antenna device includes a package, a first dielectric layer, a feeding line, a ground element, a second dielectric layer, and a radiating element. The package includes a radio frequency (RF) die and a molding compound surrounds the RF die. The first dielectric layer is over the RF die and the molding compound. The feeding line is in the first dielectric layer. The ground element is in the first dielectric layer. The second dielectric layer is over the ground element. The radiating element on the second dielectric layer and electrically coupled to the RF die, wherein the ground element is between the radiating element and the feeding line.

In accordance with some embodiments of the present disclosure, a method for manufacturing an antenna device includes forming a first opening and a second opening in a photo resist on a seed layer; simultaneously plating a conductor and a director on the seed layer and respectively in the first and second openings of the photo resist, wherein the conductor has a different top-view shape from the director; removing the photo resist and portions of the seed layer underlying the photo resist such that a buffer layer is exposed; placing a radio frequency (RF) die on the buffer layer; and forming a molding compound to surround the RF die, the conductor, and the director.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An antenna device, comprising:
a package comprising a radio frequency (RF) die and a molding compound in contact with a sidewall of the RF die;
a first radiating element in the molding compound and electrically coupled to the RF die; and
a director in the molding compound, wherein the first radiating element is between the director and the RF die, and a top of the first radiating element is substantially coplanar with a top of the director.

2. The antenna device of claim 1, wherein the first radiating element has a height substantially the same as a height of the molding compound.

3. The antenna device of claim 1, further comprising:
a connection element in the molding compound and adjoining the first radiating element to define an L-shaped conductive wall.

4. The antenna device of claim 3, wherein the connection element and the director extend along different directions from a top view.

5. The antenna device of claim 1, wherein the first radiating element and the director extend along a same direction from a top view.

6. The antenna device of claim 1, wherein the molding compound has a portion between the first radiating element and the director.

7. The antenna device of claim 1, further comprising:
a first ground element in the molding compound, wherein the first radiating element is between the first ground element and the director.

8. The antenna device of claim 7, wherein the molding compound has a portion between the first radiating element and the first ground element.

9. The antenna device of claim 7, further comprising:
a first dielectric layer over the RF die and the molding compound;
a via in the first dielectric layer;
a second dielectric layer over the first dielectric layer; and
a second ground element in the second dielectric layer and electrically connected to the first ground element through the via.

10. The antenna device of claim 1, further comprising:
a first dielectric layer over the RF die and the molding compound;
a via in the first dielectric layer;
a second dielectric layer over the first dielectric layer; and
a second radiating element in the second dielectric layer and electrically connected to the first radiating element through the via.

11. The antenna device of claim 1, further comprising:
a first dielectric layer over the RF die and the molding compound;
a feeding line in the first dielectric layer and electrically connected to the RF die;
a ground element in the first dielectric layer;
a second dielectric layer over the first dielectric layer and the ground element; and
a second radiating element on the second dielectric layer and electrically coupled to the RF die.

12. The antenna device of claim 1, further comprising:
a thermal plate thermally coupled with the RF die.

13. The antenna device of claim 12, further comprising:
a thermally conductive bump thermally coupled with the thermal plate.

14. An antenna device, comprising:
a package comprising a radio frequency (RF) die and a molding compound laterally surrounding the RF die;
a first dielectric layer over the RF die and the molding compound;
a feeding line in the first dielectric layer;
a ground element in the first dielectric layer;
a second dielectric layer over the ground element;
a radiating element on the second dielectric layer and electrically coupled to the RF die, wherein the ground element is between the radiating element and the feeding line;
a third dielectric layer laterally surrounding the radiating element;
a fourth dielectric layer over the third dielectric layer; and
a director on the fourth dielectric layer.

15. The antenna device of claim 14, wherein the first dielectric layer and the fourth dielectric layer comprise different materials.

16. The antenna device of claim 14, wherein the first and second dielectric layers comprise different materials.

17. The antenna device of claim 14, wherein the radiating element overlaps with a discontinuous region in the ground element from a cross-sectional view.

18. The antenna device of claim 14, wherein an entirety of the feeding line is separated from the radiating element by the second dielectric layer.

19. A method, comprising:
forming a thermal plate over a buffer layer;
forming a seed layer over the thermal plate and the buffer layer;
forming a first opening and a second opening in a photo resist on the seed layer;
after forming the thermal plate, simultaneously plating a conductor and a director on the seed layer and respectively in the first and second openings of the photo resist, wherein the conductor has a different top-view shape from the director;

removing the photo resist and portions of the seed layer underlying the photo resist such that the buffer layer is exposed;

placing a radio frequency (RF) die on the buffer layer; and forming a molding compound to surround the RF die, the conductor, and the director.

20. The method of claim 19, wherein removing the photo resist and portions of the seed layer underlying the photo resist is further such that the thermal plate is exposed.

* * * * *